(12) United States Patent
Shim

(10) Patent No.: US 10,410,728 B2
(45) Date of Patent: Sep. 10, 2019

(54) THREE DIMENSIONAL NONVOLATILE MEMORY DEVICE AND PROGRAMMING METHOD UTILIZING MULTIPLE WORDLINE INHIBIT VOLTAGES TO REDUCE HOT CARRIER INJECTION

(71) Applicant: SAMSUNG ELECTRONICS CO., LTD., Suwon-si, Gyeonggi-do (KR)

(72) Inventor: Sang-Won Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/908,051

(22) Filed: Feb. 28, 2018

(65) Prior Publication Data

US 2019/0080768 A1    Mar. 14, 2019

(30) Foreign Application Priority Data

Sep. 12, 2017 (KR) .................. 10-2017-0116662

(51) Int. Cl.

| G11C 16/34 | (2006.01) |
|---|---|
| G11C 16/10 | (2006.01) |
| G11C 16/12 | (2006.01) |
| G11C 16/08 | (2006.01) |
| G11C 16/04 | (2006.01) |

(Continued)

(52) U.S. Cl.
CPC .......... *G11C 16/34* (2013.01); *G11C 11/5628* (2013.01); *G11C 16/0483* (2013.01); *G11C 16/08* (2013.01); *G11C 16/10* (2013.01); *G11C 16/12* (2013.01); *G11C 16/32* (2013.01); *G11C 16/3418* (2013.01); *G11C 16/3427* (2013.01); *G11C 8/08* (2013.01); *G11C 2211/5648* (2013.01)

(58) Field of Classification Search
CPC ....... G11C 16/12; G11C 16/0483; G11C 8/08; G11C 16/08
See application file for complete search history.

(56) References Cited

U.S. PATENT DOCUMENTS

| 7,099,193 B2 | 8/2006 | Futatsuyama |
|---|---|---|
| 7,623,386 B2 | 11/2009 | Dong et al. |

(Continued)

FOREIGN PATENT DOCUMENTS

| KR | 10-0905868 | 6/2009 |
|---|---|---|
| KR | 10-0967006 | 6/2010 |

*Primary Examiner* — Ajay Ojha
(74) *Attorney, Agent, or Firm* — Volentine, Whitt & Francos, PLLC

(57) ABSTRACT

A nonvolatile memory device for reducing hot-carrier injection (HCI) and a programming method of the nonvolatile memory device, the programming method of the nonvolatile memory device includes programming memory cells included in a cell string in a direction from an upper memory cell adjacent to a string selection transistor to a lower memory cell adjacent to a ground selection transistor from among a plurality of memory cells; when a selected memory cell is programmed, applying a first inhibition voltage to first non-selected word lines connected to first non-selected memory cells located over the selected memory cell; and applying a second inhibition voltage to second non-selected word lines connected to second non-selected memory cells located under the selected memory cell when a predetermined delay time elapses after the first inhibition voltage is applied.

20 Claims, 22 Drawing Sheets

(51) Int. Cl.
*G11C 11/56* (2006.01)
*G11C 16/32* (2006.01)
G11C 8/08 (2006.01)

(56) References Cited

U.S. PATENT DOCUMENTS

| | | |
|---|---|---|
| 8,036,028 B2 | 10/2011 | Kim |
| 8,085,601 B2 | 12/2011 | Kim |
| 8,385,115 B2 | 2/2013 | Lee et al. |
| 2008/0137425 A1* | 6/2008 | Dong ................ G11C 11/5628 365/185.18 |
| 2009/0003067 A1* | 1/2009 | Kang ................ G11C 16/0483 365/185.13 |
| 2010/0202211 A1 | 8/2010 | Park et al. |
| 2015/0228345 A1* | 8/2015 | Kwon ................ G11C 16/10 365/185.18 |
| 2018/0025783 A1* | 1/2018 | Choi ................ G11C 16/34 365/185.23 |

* cited by examiner

FIG. 12A

| PGM STATE | WHETHER TO USE DELAY TIME FOR Vpass2 |
|---|---|
| Erase(Vth1) | USE OF DELAY TIME ○ |
| Vth2~Vth8 | USE OF DELAY TIME × |

• PGM STATE = Vth1(Erase) ~ Vth8

FIG. 12B

| PGM STATE | WHETHER TO USE DELAY TIME FOR Vpass2 |
|---|---|
| Vth1 ~ Vth a | USE OF DELAY TIME ○ |
| Vth(a+1) ~ Vth8 | USE OF DELAY TIME × |

• PGM STATE = Vth1(Erase) ~ Vth8

FIG. 13A

| WL(A+1) ~ WL(A+b) PGM STATE | WHETHER TO USE DELAY TIME FOR Vpass2 |
|---|---|
| AT LEAST ONE OF b FIRST MEMORY CELLS HAVE ERASE STATE (Vth1) | USE OF DELAY TIME ○ |
| NONE OF b FIRST MEMORY CELLS HAVE ERASE STATE (Vth1) | USE OF DELAY TIME × |

• Sel WL=WL A

FIG. 13B

| WL(A+1) ~ WL(A+b) PGM STATE | WHETHER TO USE DELAY TIME FOR Vpass2 |
|---|---|
| NUMBER OF MEMORY CELLS HAVING ERASED STATE (Vth1) ≥ REFERENCE VALUE | USE OF DELAY TIME ○ |
| NUMBER OF MEMORY CELLS HAVING ERASED STATE (Vth1) < REFERENCE VALUE | USE OF DELAY TIME × |

• Sel WL=WL A

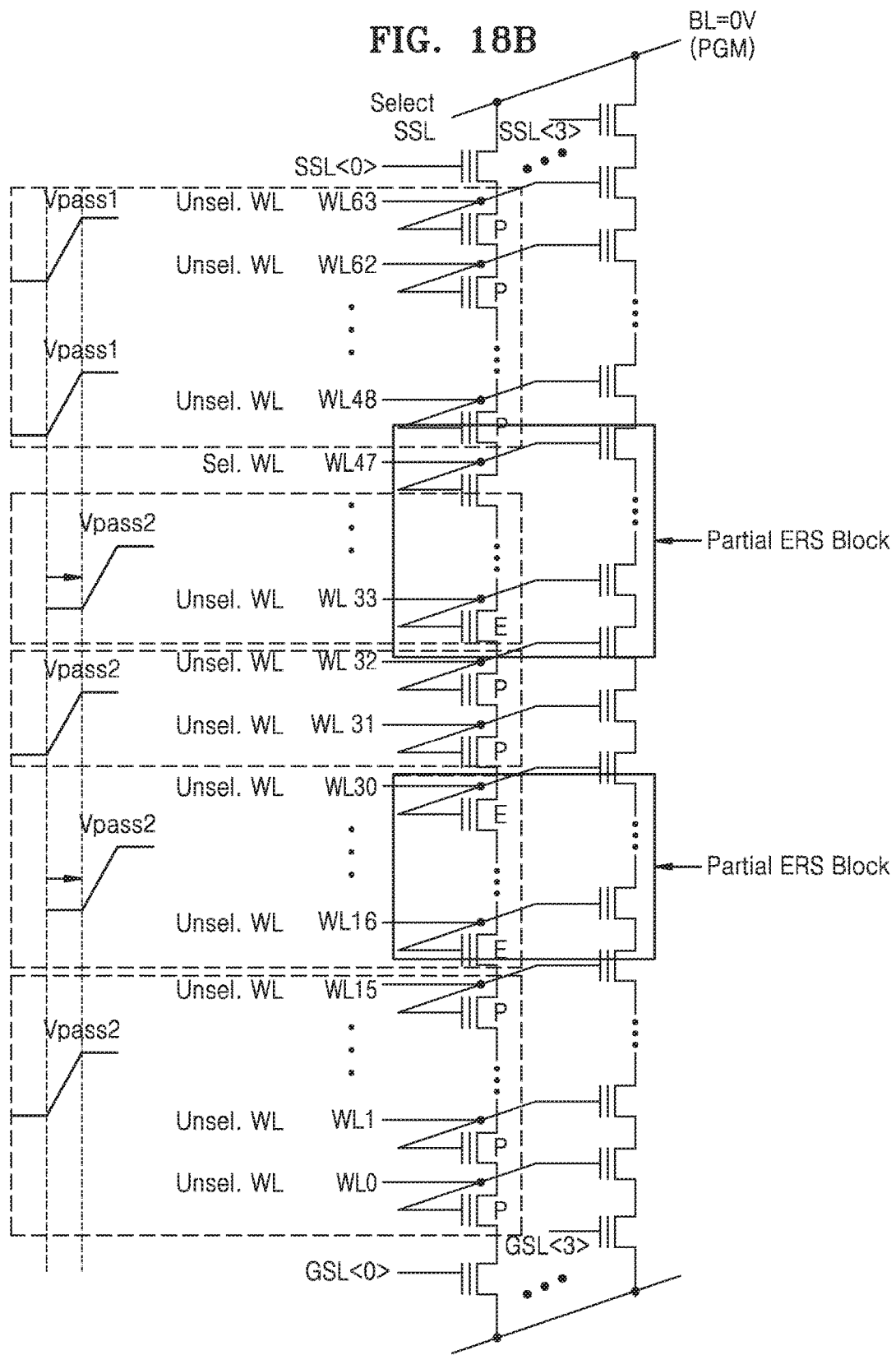

THREE DIMENSIONAL NONVOLATILE MEMORY DEVICE AND PROGRAMMING METHOD UTILIZING MULTIPLE WORDLINE INHIBIT VOLTAGES TO REDUCE HOT CARRIER INJECTION

CROSS-REFERENCE TO RELATED APPLICATION

This application claims the benefit of Korean Patent Application No. 10-2017-0116662, filed on Sep. 12, 2017, in the Korean Intellectual Property Office, the disclosure of which is incorporated herein in its entirety by reference.

BACKGROUND

The inventive concept relates to a programming method of a nonvolatile memory device, and more particularly, to a programming method to reduce hot-carrier injection (HCI) occurring in the channel of memory cells, and thereby improving programming performance of the memory device.

A nonvolatile semiconductor memory device includes a plurality of memory cells for storing data in a nonvolatile manner A flash memory device that is a nonvolatile memory device may be used in a mobile phone, a digital camera, a personal digital assistant (PDA), a mobile computer device, a stationary computer device, and other devices.

A flash memory device may undergo disturbance during a program operation due to a structure of the flash memory device. For example, as disturbance occurs due to HCI or the like, a threshold voltage distribution of memory cells may be changed, thereby degrading characteristics of a memory operation.

SUMMARY

The inventive concept provides a nonvolatile memory device for reducing disturbance during a program operation and a programming method of the nonvolatile memory device.

According to an aspect of the inventive concept, there is provided a programming method of a nonvolatile memory device including one or more cell strings each including a plurality of memory cells vertically located on a substrate, the programming method including: programming the plurality of memory cells included in each of the one or more strings in a direction from an upper memory cell from among the plurality of memory cells to a lower memory cell from among the plurality of memory cells on the substrate; when a selected memory cell is programmed, applying a first inhibition voltage to first non-selected word lines connected to first non-selected memory cells located over the selected memory cell; and applying a second inhibition voltage to second non-selected word lines connected to second non-selected memory cells located under the selected memory cell when a predetermined delay time elapses after the first inhibition voltage is applied.

According to another aspect of the inventive concept, there is provided a programming method of a nonvolatile memory device including three-dimensional (3D) NAND memory cells vertically located on a substrate, the programming method including: applying a program voltage to a word line connected to a selected memory cell; applying a first inhibition voltage to a first non-selected word line connected to a first non-selected memory cell that is located over the selected memory cell and is previously programmed; and applying a second inhibition voltage to a second non-selected word line connected to a second non-selected memory cell that is located under the selected memory cell and is not programmed, wherein at least one from among a level, a level rising gradient, and a rise timing of the second inhibition voltage is controlled differently from that of the first inhibition voltage.

According to another aspect of the inventive concept, there is provided a nonvolatile memory device including: a memory cell array including a plurality of cell strings each including a plurality of memory cells vertically located on a substrate; a voltage generator configured to generate, during a program operation performed on the memory cell array, a program voltage applied to a word line connected to a selected memory cell, a first inhibition voltage applied to first non-selected word lines connected to first non-selected memory cells located over the selected memory cell, and a second inhibition voltage applied to second non-selected word lines connected to second non-selected memory cells located under the selected memory cell; and a control logic unit configured to control the program operation to be performed in a direction from an upper memory cell to a lower memory cell in each of the plurality of cell strings and to control at least one from among a level and a rise timing of the second inhibition voltage to be different from that of the first inhibition voltage.

BRIEF DESCRIPTION OF THE DRAWINGS

Embodiments of the inventive concept will be more clearly understood from the following detailed description taken in conjunction with the accompanying drawings in which:

FIGS. 11A, 11B, 12A, 12B, 13A and 13B are diagrams illustrating an example where a delay time is selectively used for a second inhibition voltage by referring to data that is previously programmed according to an embodiment;

FIGS. 18A and 18B are circuit diagrams illustrating an example where a partial erase block exists according to an embodiment.

DETAILED DESCRIPTION OF THE EMBODIMENTS

The inventive concept will now be described more fully with reference to the accompanying drawings, in which embodiments are shown.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
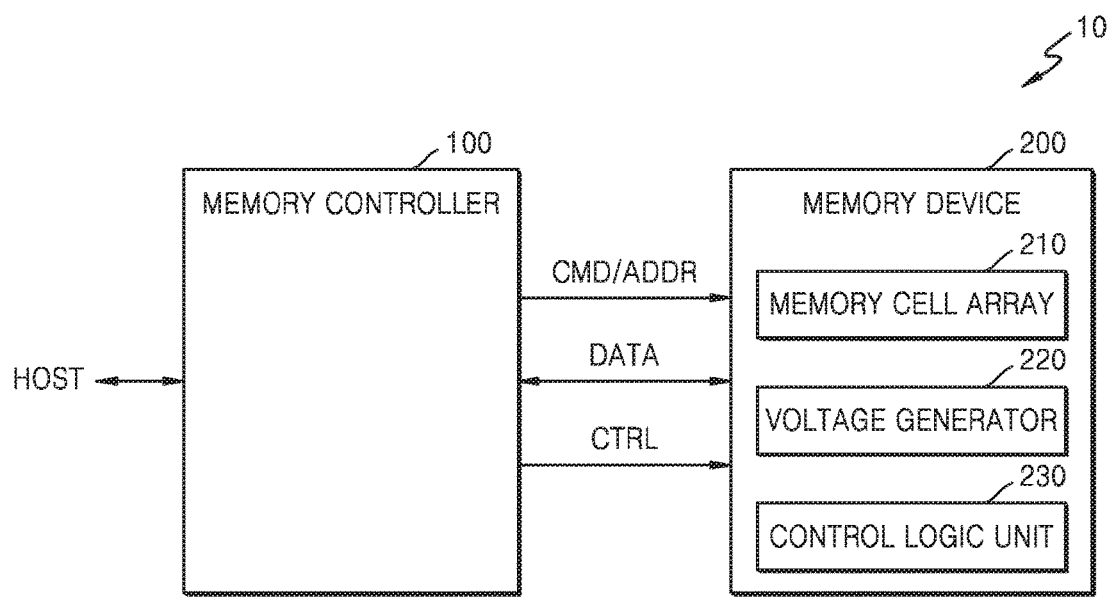
FIG. 1 is a block diagram of a memory system according to an embodiment.

FIG. 1 is a block diagram of a memory system 10 according to an embodiment. Referring to FIG. 1, the memory system 10 may include a memory controller 100 and a memory device 200. The memory device 200 may include a memory cell array 210, a voltage generator 220, and a control logic unit 230.

According to an embodiment, the memory device 200 may include a nonvolatile memory device. In some embodiments, the memory system 10 may be an internal memory embedded in an electronic apparatus, and in this case, examples of the memory system 10 may include an embedded universal flash storage (UFS) memory device, an embedded multi-media card (eMMC), and a solid-state drive (SSD). In some embodiments, the memory system 10 may be an external memory detachably attached to an electronic apparatus, and in this case, examples of the memory system 10 may include a UFS memory card, a compact flash (CF) card, a secure digital (SD) card, a micro-secure digital (micro-SD) card, a mini-secure digital (mini-SD) card, an extreme digital (xD) card, and a memory stick.

The memory controller 100 may control the memory device 200 to read data stored in the memory device 200 or program data to the memory device 200 in response to a read/write request from a host HOST. In detail, the memory controller 100 may control a program operation, a read operation, and an erase operation on the memory device 200 by applying an address ADDR, a command CMD, and a control signal CTRL to the memory device 200. In addition, data DATA for a program operation and read data DATA may be transmitted/received between the memory controller 100 and the memory device 200.

The memory cell array 210 may include a plurality of memory cells, and the plurality of memory cells may be, for example, flash memory cells. This embodiment illustrates in which the plurality of memory cells are NAND flash memory cells. However, the inventive concept is not limited thereto, and in some embodiments, the plurality of memory cells may be resistive memory cells such as resistive random-access memory (ReRAM) cells, phase change RAM (PRAM) cells, or magnetic RAM (MRAM) cells.

The memory cell array 210 may include a plurality of cell strings (or NAND strings) respectively connected to intersections where a plurality of string selection lines and a plurality of bit lines intersect each other, and each of the cell strings may include a plurality of memory cells. Additionally, the memory cells included in each cell string may be connected in series between a string selection transistor and a ground selection transistor, and the string selection transistor may be connected to a bit line and the ground selection transistor may be connected to a common source line. The cell string may extend in a direction perpendicular to a semiconductor substrate (not shown). Accordingly, each cell string may include a plurality of memory cells that are vertically located on the semiconductor substrate.

The memory device 200 may control a program operation performed on the memory cell array 210 in various ways. For example, the control logic unit 230 may control a program operation for program data to be stored in a direction from an upper memory cell in each cell string to a lower memory cell in the cell string. That is, the program data may be programmed in a direction from a memory cell close to the bit line (or the string selection transistor) to a memory cell close to the common source line (or the ground selection transistor). Such a programming method may be referred to as a top-to-bottom programming method because data is programmed in a direction from an upper memory cell to a lower memory cell.

When data of a selected memory cell is programmed according to a top-to-bottom programming method, one or more memory cells adjacent to the selected memory cell may be disturbed due to channel potential differences. For example, non-selected memory cells which are memory cells other than the selected memory cell may include first non-selected memory cells located over the selected memory cell and second non-selected memory cells located under the selected memory cell. At least one memory cell from among the first non-selected memory cells located over the selected memory cell in the top-to-bottom programming method may be disturbed by hot-carrier injection (HCI) which occurs due to channel potential differences.

Because ground voltage may be applied to a bit line of a selected memory cell and the first non-selected memory cells that are already programmed have a high threshold voltage, the first non-selected memory cells may be turned off during a setup process for the program operation. In contrast, because electrical connection between the second non-selected memory cells and the bit line may be cut off due to the first non-selected memory cells and a channel potential of the second non-selected memory cells may be increased due to channel boosting in the setup process for the program operation, the first non-selected memory cells may be turned on. A level difference between a potential (hereinafter, referred to as a first channel potential) of a channel corresponding to the first non-selected memory cells and a potential (hereinafter, referred to as a second channel potential) of a channel corresponding to the second non-selected memory cells may be increased, thereby causing hot carrier injection (HCI) on one of the first non-selected memory cells adjacent to the second non-selected memory cells. As a result of the hot carrier injection, threshold voltage of the memory cells affected by the hot carrier injection may be drifted and overall performance of the memory device may degrade.

According to an embodiment, when a program operation using a top-to-bottom method is performed on a cell string, voltage biasing condition applied to word lines of memory cells may be controlled in order to reduce degradation due to HCI. For example, levels and/or rise timings of voltages applied to word lines may be variously controlled. For example, the control of the control logic unit 230 may control a first inhibition voltage applied to word lines (e.g., first non-selected word lines) of first non-selected memory cells and a second inhibition voltage applied to word lines (e.g., second non-selected word lines) of second non-selected memory cells. The control on levels and/or rise timings of the first and second inhibition voltages may reduce a level difference between a first channel potential and a second channel potential at a point in time when the first non-selected memory cells are turned on. Specifically, the second inhibition voltage may be applied to the second non-selected word lines after a predetermined time period after applying the first inhibition voltage. Because of the delayed biasing on the second non-selected word lines, a channel boosting effect may become smaller, and thus potential at the second non-selected word lines may be lower and potential differences between adjacent memory cells may be reduced.

The voltage generator 220 may generate a program voltage applied to a selected word line and first and second inhibition voltages applied to non-selected word lines. Also, rise timings of the first and second inhibition voltages applied to the non-selected word lines may be controlled in various ways. For example, the HCI influence may be reduced by adjusting timings when the voltage generator 220 generates the program voltage and the first and second inhibition voltages under the control of the control logic unit 230. For example, the HCI influence may be reduced by adjusting timings when the program voltage and the first and second inhibition voltages are applied to word lines through a row decoder.

Levels and/or rise timings of the program voltage and the first and second inhibition voltages may be controlled in various ways. For example, the control logic unit 230 may generate a voltage control signal for controlling levels and/or rise timings of the program voltage and the first and second inhibition voltages, and may apply the voltage control signal to the voltage generator 220 or the row decoder. For example, when a predetermined time period elapses after the voltage generator 220 generates the first inhibition voltage and applies the first inhibition voltage to the row decoder, the voltage generator 220 may generate the second inhibition voltage and may apply the second inhibition voltage to the row decoder under the control of the control logic unit 230.

According to the present embodiment, disturbance due to HCI in a program operation using a top-to-bottom method on memory cells that are vertically stacked may be reduced, and the performance of the program operation may be improved.

Figure 2:
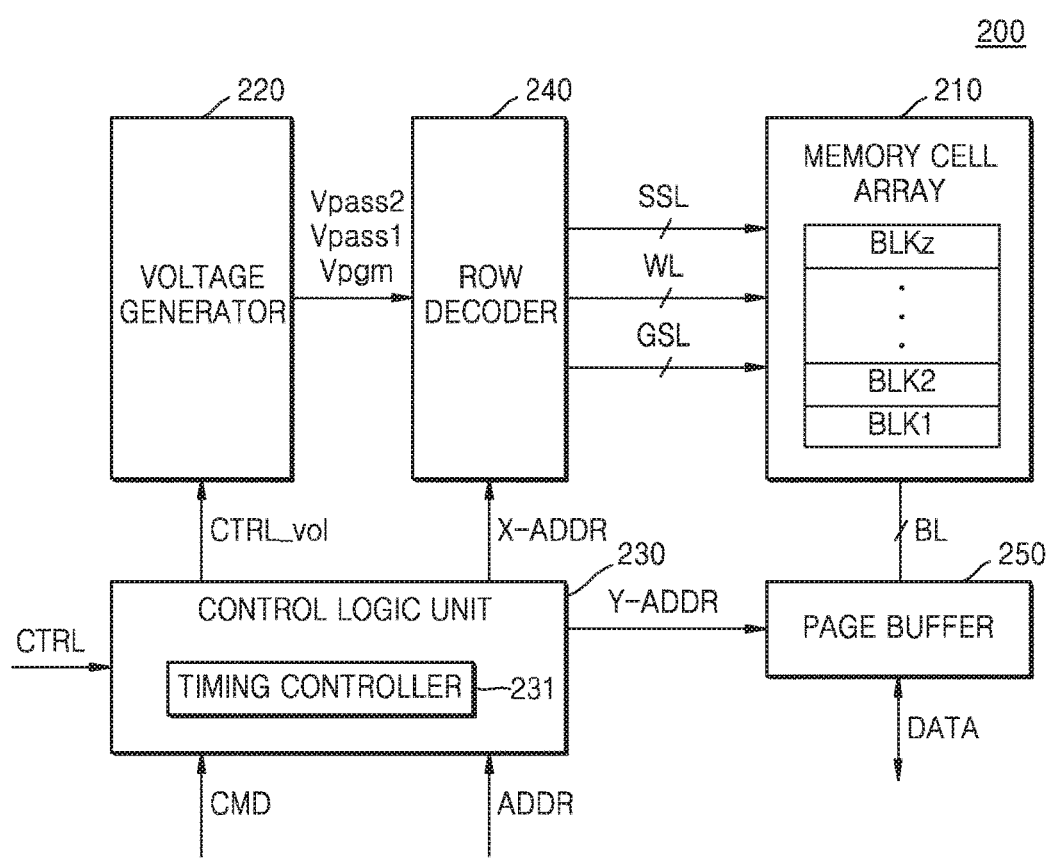
FIG. 2 is a block diagram of a memory device of FIG. 1 according to an embodiment.

FIG. 2 is a block diagram of the memory device 200 of FIG. 1 according to an embodiment.

Referring to FIGS. 1 and 2, the memory device 200 may include the memory cell array 210, the voltage generator 220, the control logic unit 230, a row decoder 240, and a page buffer 250. Although not shown in FIG. 2, the memory device 200 may further include a data input/output circuit or an input/output interface.

The memory cell array 210 may include a plurality of memory cells connected to word lines WL. The word lines WL may be connected to a row decoder 240. The memory cell array may be further connected to the string selection lines SSL, and the ground selection lines GSL, and to the page buffer 250 through the bit lines BL. Each of the memory cells may store one or more bits. In detail, each memory cell may be used as a single-level cell (SLC), a multi-level cell (MLC), or a triple-level cell (TLC). The memory cell array 210 may include for example memory blocks BLK1, BLK2, . . . BLKz.

In an embodiment, the memory cell array 210 may include a two-dimensional (2D) memory cell array, and the 2D memory cell array may include a plurality of cell strings that are arranged in rows and columns. Also, according to an embodiment, the memory cell array 210 may include a three-dimensional (3D) memory cell array, and the 3D memory cell array may include a plurality of cell strings and each of the cell strings may include memory cells respectively connected to word lines that are vertically stacked on a substrate, as described below in detail with reference to FIGS. 3 and 4. U.S. Pat. Nos. 7,679,133, 8,553,466, 8,654,587, 8,559,235, and U.S. Patent Application No. 2011/0233648 disclose appropriate elements of a 3D memory array in which the 3D memory array includes a plurality of levels and word lines and/or bit lines are shared by the levels. The content of each of U.S. Pat. Nos. 7,679,133, 8,553,466, 8,654,587, 8,559,235, and U.S. Patent Application No. 2011/0233648 is incorporated herein in its entirety by reference.

The control logic unit 230 may output various internal control signals for programming data to the memory cell array 210 or reading data from the memory cell array 210, based on the command CMD, the address ADDR, and the control signal CTRL received from the memory controller 100. Also, the voltage generator 220 may generate various voltages used in the memory device 200. For example, the voltage generator 220 may generate a program voltage Vpgm applied to a selected word line for a program operation, a first inhibition voltage Vpass1 applied to first non-selected word lines, and a second inhibition voltage Vpass2 applied to second non-selected word lines. Also, although not shown in FIG. 2, the voltage generator 220 may further generate a string selection voltage and a ground selection voltage (not shown) respectively applied to the string selection lines SSL and the ground selection lines GSL.

According to an embodiment, the control logic unit 230 may output a voltage control signal CTRL_vol for controlling levels and/or rise timings of various voltages generated by the voltage generator 220. For example, when HCI is reduced by controlling rise timings of the various voltages, the control logic unit 230 may include a timing controller 231 for controlling timings when the various voltages are generated. Although not shown in FIG. 2, when HCI is reduced by adjusting levels of the various voltages, the control logic unit 230 may further include an element for adjusting levels of the various voltages.

The control logic unit 230 may apply a row address X-ADDR to the row decoder 240 and may apply a column address Y-ADDR to the page buffer 250. The row decoder 240 may apply the program voltage Vpgm to a word line of a selected memory cell in response to the row address X-ADDR, and may apply the first and second inhibition voltages Vpass1 and Vpass2 to word lines of non-selected memory cells.

Figure 3:
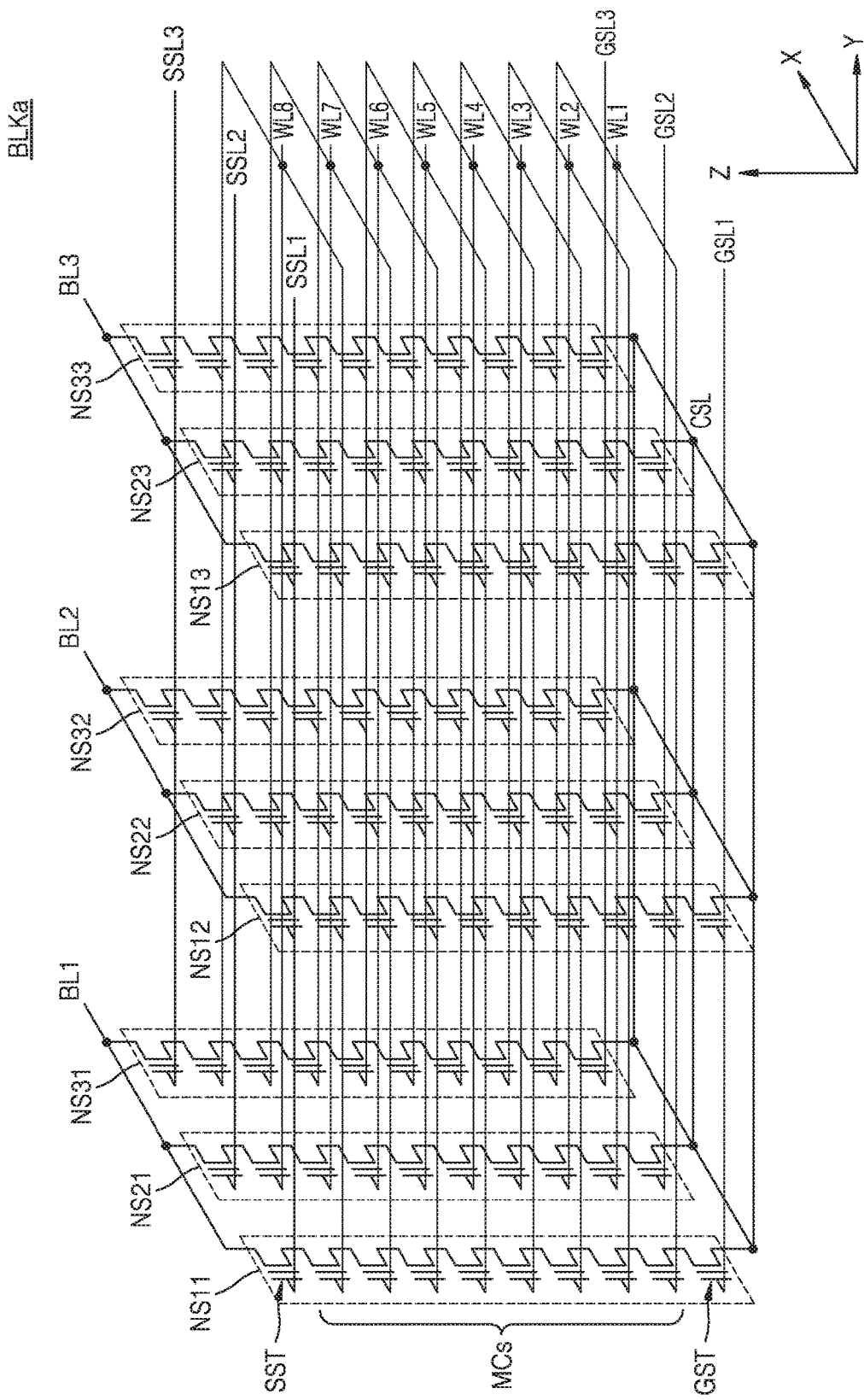
FIG. 3 is a circuit diagram illustrating an equivalent circuit of a memory block having a three-dimensional (3D) structure according to an embodiment.

FIG. 3 is a circuit diagram illustrating an equivalent circuit of a memory block having a 3D structure according to an embodiment.

Referring to FIG. 3, an $a^{th}$ memory block BLKa may include a plurality of cell strings NS11 through NS33, a plurality of word lines WL1 through WL8, a plurality of bit lines, for example, first through third bit lines BL1 through BL3, a plurality of ground selection lines GSL1 through GSL3, a plurality of string selection lines SSL1 through SSL3, and a common source line CSL. The number of cell strings, the number of word lines, the number of bit lines, the number of ground selection lines, and the number of string selection lines may be changed in various ways according to embodiments.

The cell strings NS11, NS21, and NS31 are provided between the first bit line BL1 and the common source line CSL, the cell strings NS12, NS22, and NS32 are provided between the second bit line BL2 and the common source line CSL, and the cell strings NS13, NS23, and NS33 are provided between the third bit line BL3 and the common source line CSL. Each cell string (e.g., NS11) may include a string selection transistor SST, a plurality of memory cells MC, and a ground selection transistor GST that are connected in series.

The string selection transistors SST are connected to the string selection lines SSL1 through SSL3 corresponding to the string selection transistors SST. The plurality of memory cells MC are respectively connected to the word lines WL1 through WL8. The ground selection transistors GST are connected to the ground selection lines GSL1 through GSL3 corresponding to the ground selection transistors GST. The string selection transistors SST are connected to the first through third bit lines BL1 through BL3 corresponding to the string selection transistors SST, and the ground selection transistor GST is connected to the common source line CSL.

In the present embodiment, word lines (e.g., WL1) having the same height are commonly connected to one another, the string selection lines SSL1 through SSL3 are separated from one another, and the ground selection lines GSL1 through GSL3 are separated from one another. Although three string selection lines SSL1 through SSL3 share word lines having the same height in FIG. 4, the inventive concept is not limited thereto. For example, two string selection lines may share word lines having the same height. Alternatively, four string selection lines may share word lines having the same height.

Figure 4:
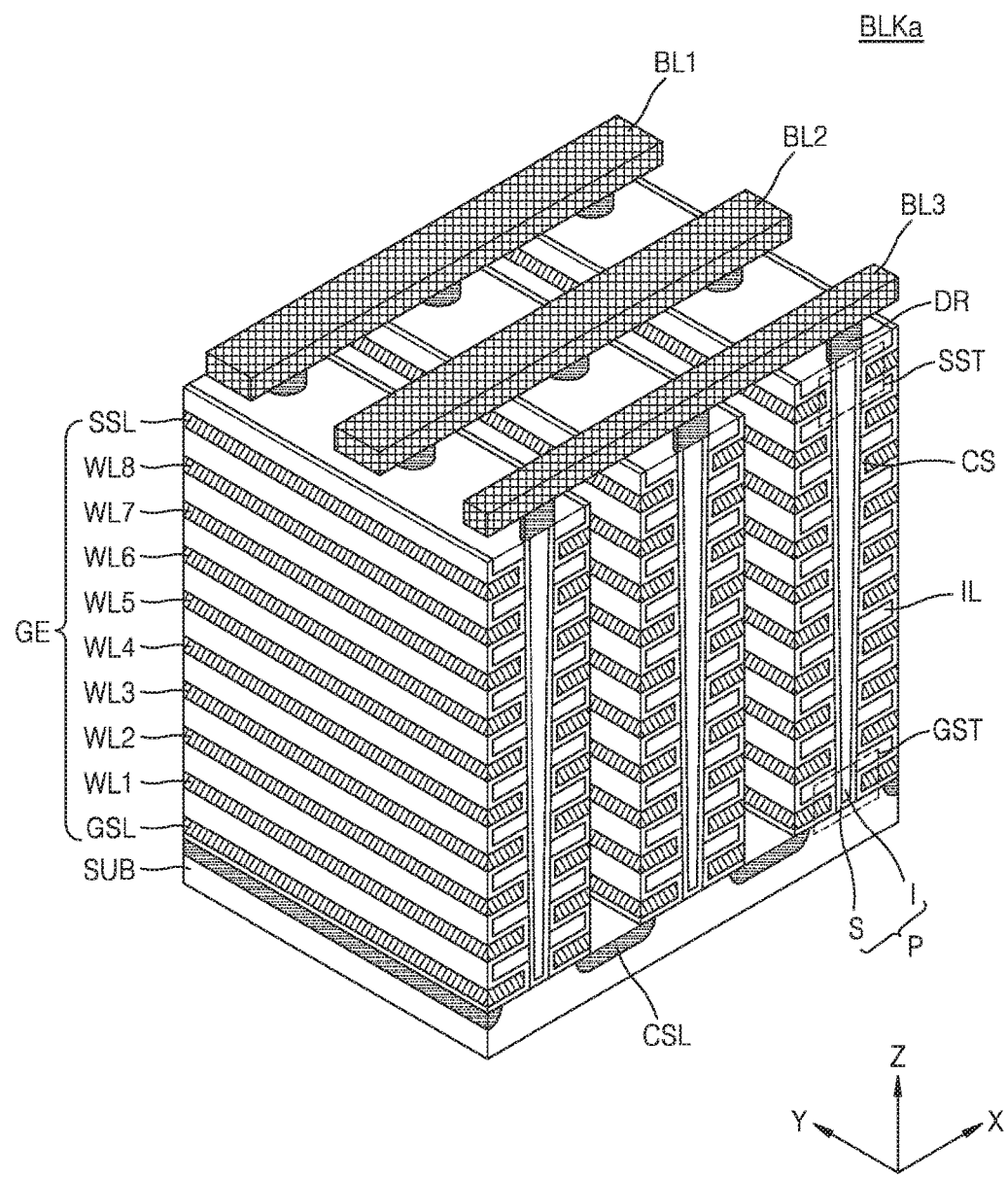
FIG. 4 is a perspective view of a memory block according to an embodiment.

FIG. 4 is a perspective view of the $a^{th}$ memory block BLKa according to an embodiment. Referring to FIG. 4, the $a^{th}$ memory block BLKa is vertically formed on a substrate SUB. The substrate SUB is a substrate of a first conductivity type (e.g., a p-type), and the common source line CSL that extends in a first direction (e.g., a Y direction) and is doped with impurities of a second conductivity type (e.g., an n-type) is provided on the substrate SUB. A plurality of insulating films IL that extend in the first direction are sequentially provided in a third direction (e.g., a Z direction) in a region of the substrate SUB between two adjacent common source lines CSL and are spaced apart by a predetermined interval from one another in the third direction. For example, the plurality of insulating films IL may include an insulating material such as silicon oxide.

A plurality of pillars P that are sequentially arranged in the first direction and pass through the plurality of insulating films IL in the third direction are provided in a region of the substrate SUB between two adjacent common source lines CSL. For example, the plurality of pillars P may pass through the plurality of insulating films IL and may contact the substrate SUB. In detail, a surface layer S of each of the pillars P may include a silicon material of a first type, and may function as a channel region. An internal layer I of each pillar P may include an insulating material such as silicon oxide or an air gap.

A charge storage layer CS is provided along exposed surfaces of the insulating films IL, the pillars P, and the substrate SUB in a region between two adjacent common source lines CSL. The charge storage layer CS may include a gate insulating layer (or referred to as a 'tunneling insulating layer'), a charge trap layer, and a blocking insulating layer. For example, the charge storage layer CS may have an oxide-nitride-oxide (ONO) structure. Also, gate electrodes GE such as the selection lines GSL and SSL and the word lines WL1 through WL8 are provided on an exposed surface of the charge storage layer CS, in a region between two adjacent common source lines CSL.

Drains or drain contacts DR are respectively provided on the plurality of pillars P. For example, the drains or the drain contacts DR may include a silicon material doped with impurities of a second conductivity type. The first through third bit lines BL1 through BL3 that extend in a second direction (e.g., an X direction) and are spaced apart by a predetermined interval from one another in the first direction are provided on the drains or the drain contacts DR. Ground selection transistors GST and string selection transistors SST are also shown.

Various embodiments for reducing disturbance due to HCI will now be described. Examples where HCI is reduced by adjusting rise timings of first and second inhibition voltages will now be described.

Figure 5:
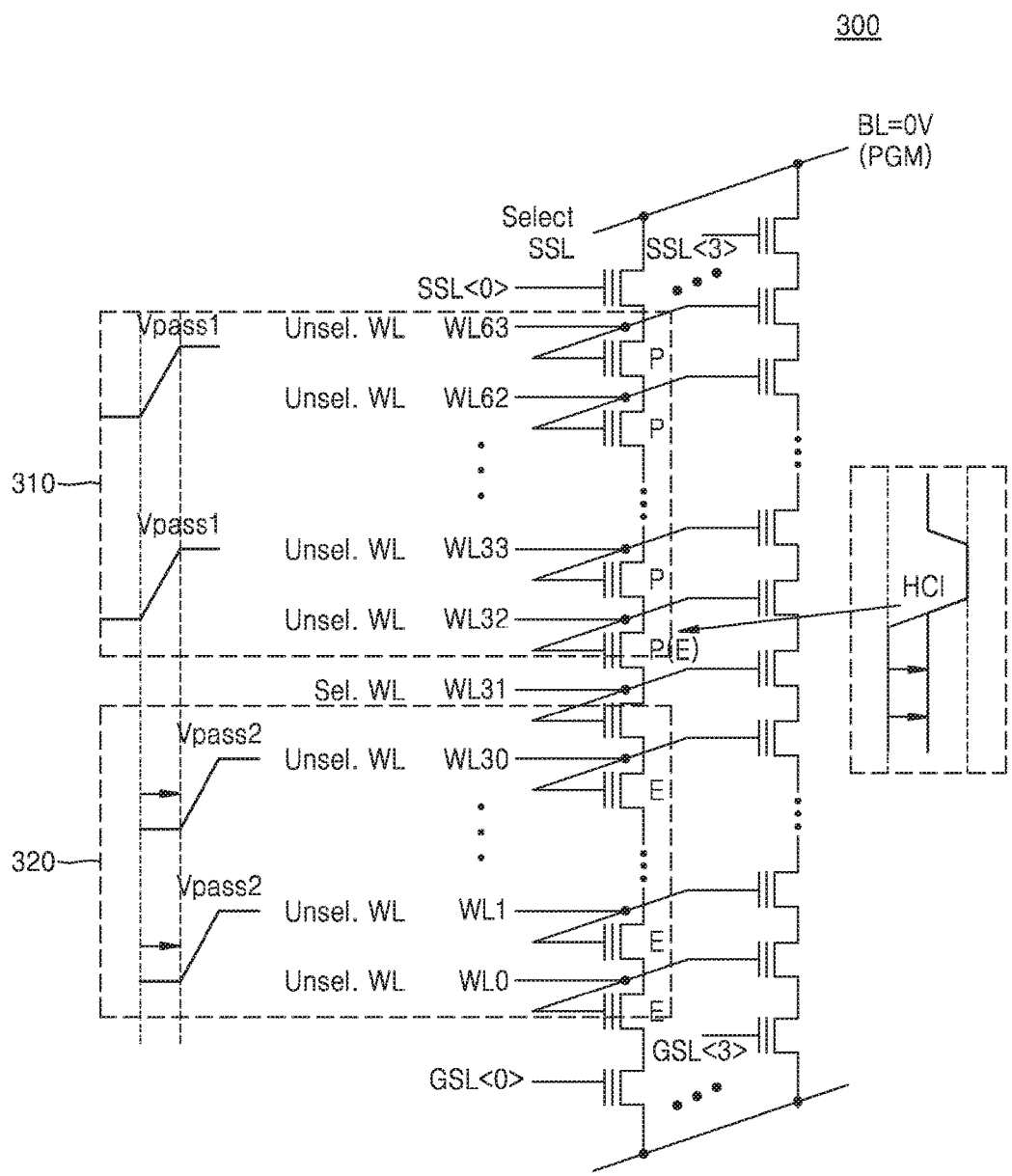
FIG. 5 is a circuit diagram illustrating an example where hot-carrier injection (HCI) is reduced in a 3D flash memory device according to an embodiment.

FIG. 5 is a circuit diagram illustrating an example where HCI is reduced in a 3D flash memory device according to an embodiment. In FIG. 5, a cell string connected to a first string selection line SSL<0> from among a plurality of cell strings connected to one bit line is selected and is connected to word lines WL0 through WL63 corresponding to 64 memory cells. Also, it is assumed that as 32 memory cells are selected, a program voltage is applied to a selected word line WL31.

In a program operation of a memory device 300, the selected cell string may include a selected memory cell and non-selected memory cells. The non-selected memory cells located over the selected memory cell may be referred as first non-selected memory cells 310, and non-selected memory cells located under the selected memory cell may be referred as second non-selected memory cells 320. When the memory device 300 performs a program operation according to a top-to-bottom method, there may be a situation in which the first non-selected memory cells 310 correspond to memory cells that are programmed and the second non-selected memory cells 320 correspond to memory cells that are not yet programmed.

The second non-selected memory cells 320 have an erased state E. Since the first non-selected memory cells 310 may be randomly programmed, some of the first non-selected memory cells 310 may have a programmed state P having an increased threshold voltage level, some of the first non-selected memory cells 310 may be programmed to an erased state. In order to be distinguished from the erased state E of the second non-selected memory cells 320, the erased state of some of the first non-selected memory cells 310 is denoted by P(E) in FIG. 5.

The first non-selected memory cells 310 may be connected to a bit line BL to which a voltage of 0 V is applied while programming operation is being carried out, and thus a voltage of 0 V may be applied to a channel region corresponding to the first non-selected memory cells 310. Because the first non-selected memory cells 310 already have been programmed to a programmed state, the first non-selected memory cells 310 may have a high threshold voltage. The second non-selected memory cells 320 may be electrically insulated from the bit line BL due to some of the first non-selected memory cells which have been programmed to have high threshold voltages and because the selected memory cell is not yet turned on. The channel of the second non-selected memory cells may be a floating state while a ground selection transistor is turned off.

In a voltage biasing scheme where levels of the first inhibition voltage Vpass1 and the second inhibition voltage Vpass2 are simultaneously increased, a channel of the second non-selected memory cells 320 may be boosted following the level of the second inhibition voltage Vpass2, and thus a potential of the channel of the second non-selected memory cells 320 may be increased. In this case, there may be a level difference between potentials of a channel of the first non-selected memory cells 310 and the channel of the second non-selected memory cells 320. When the first non-selected memory cells 310 are turned on due to the first inhibition voltage Vpass1, HCI may occur on at least one of the first non-selected memory cells 310. Especially, the HCI may occur on one of the first non-selected memory cells which is located adjacent to the selected memory cell. As a result, the first non-selected memory cells may be greatly disturbed.

According to an embodiment, the HCI influence may be reduced by adjusting a voltage biasing time gap between the first inhibition voltage Vpass1 and the second inhibition voltage Vpass2. For example, after a predetermined delay from increasing the level of the first inhibition voltage Vpass1, the level of the second inhibition voltage may be increased. In this case, a level difference between a potential of the channel of the first non-selected memory cells 310 and a potential of the channel of the second non-selected memory cells 320 may be reduced, thereby reducing the HCI influence.

According to an embodiment, a level of the second inhibition voltage Vpass2 may be increased after the first inhibition voltage Vpass1 reaches a steady level. Alternatively, a level of the second inhibition voltage Vpass2 may be increased after the first inhibition voltage Vpass1 is increased to a level high enough to turn on the first non-selected memory cells 310. Although a level of the second inhibition voltage Vpass2 begins to be increased from a point in time when the first inhibition voltage Vpass1 reaches a steady level in FIG. 5, a level of the second inhibition voltage Vpass2 may begin to be increased earlier or later than that in FIG. 5.

Although one cell string includes 64 memory cells in FIG. 5, embodiments are not limited thereto and the number of memory cells included in one cell string may be changed in various ways.

Figure 6:
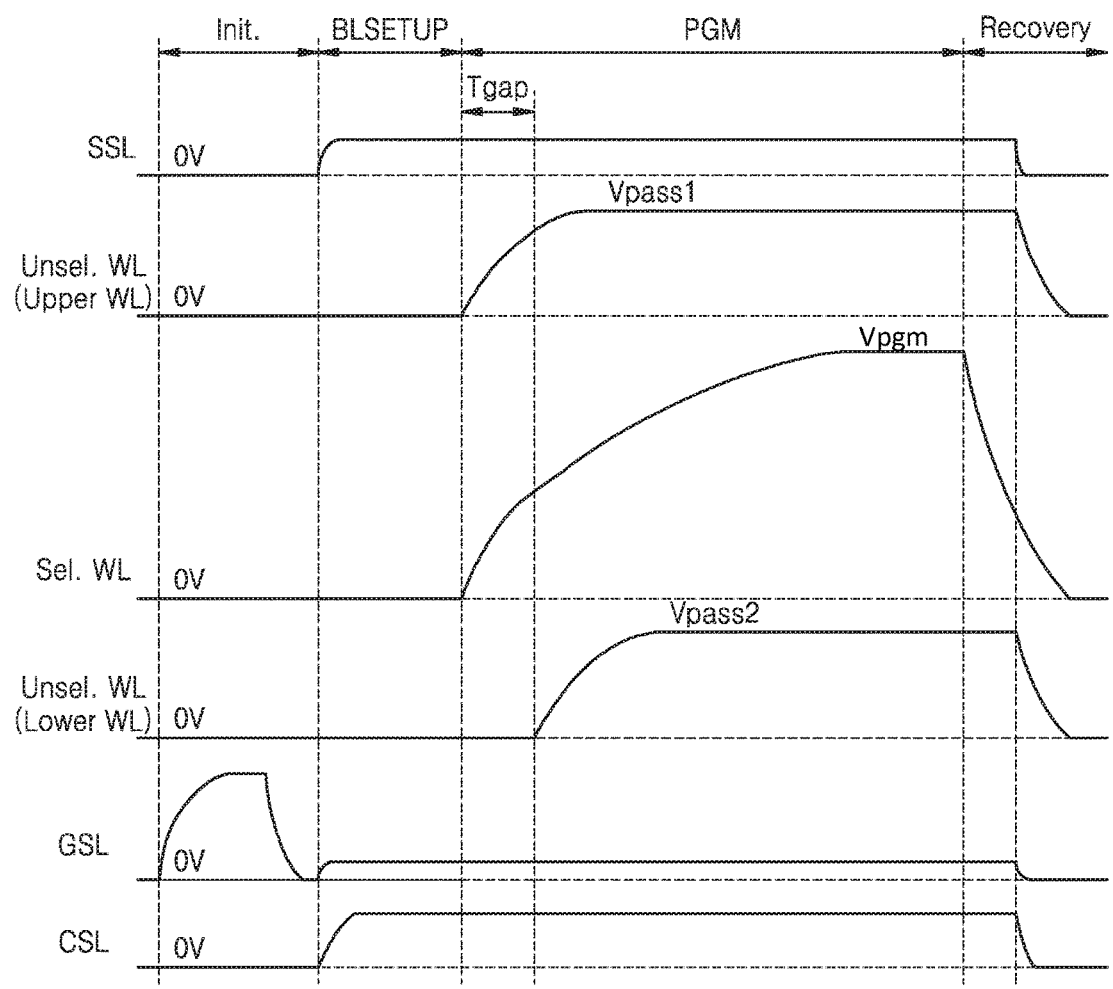
FIG. 6 is a graph illustrating waveforms of various signals for performing a program operation on a selected cell string of FIG. 5.

FIG. 6 is a graph illustrating waveforms of various signals for performing a program operation on the selected cell string of FIG. 5. FIG. 6 illustrates waveforms of signals in a program operation using a top-to-bottom method.

Referring to FIGS. 5 and 6, during an initialization interval (Init.), a voltage of 0 V is applied to the string selection line SSL, a first non-selected word line Upper WL, a selected word line Sel. WL, a second non-selected word line Lower WL, and the common source line CSL. During the initialization interval, the ground selection line GSL may be increased to a predetermined level to precharge a channel of the second non-selected memory cells 320, and then may be reduced to 0V again. Next, during a bit line setup interval (BLSETUP), voltage levels of the string selection line SSL and the common source line CSL may be increased and maintained. During the bit line setup interval, a voltage level of the ground selection line GSL may also be slightly increased and maintained.

Next, during a program interval (PGM), various voltage levels of word lines connected to memory cells may be increased. According to an embodiment, levels of the program voltage Vpgm applied to the selected word line Sel. WL and the first inhibition voltage Vpass1 applied to the first non-selected word line Upper WL may be first applied, and after a predetermined time interval Tgap, a level of the second inhibition voltage Vpass2 may be applied to the second non-selected word line Lower WL. The predetermined time interval Tgap may be set to be any of various times. For example, the time interval Tgap may be defined as a time taken to increase a level high enough to turn on the first non-selected memory cell Upper WL, and a level of the second inhibition voltage Vpass2 may be increased after a delay time corresponding to the time interval Tgap elapses. When the program voltage Vpgm is increased to a program level, data may be programmed, and during a recovery interval, voltage levels of various signals of FIG. 6 may be reset.

Figure 7:
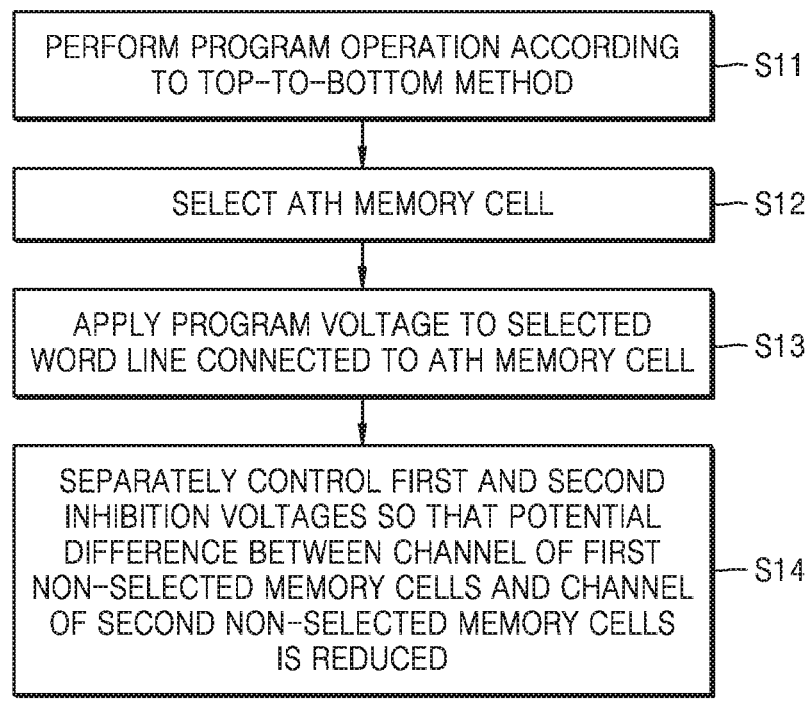
FIGS. 7 and 8 are flowcharts of a program operation of a nonvolatile memory device according to embodiments.
Figure 8:
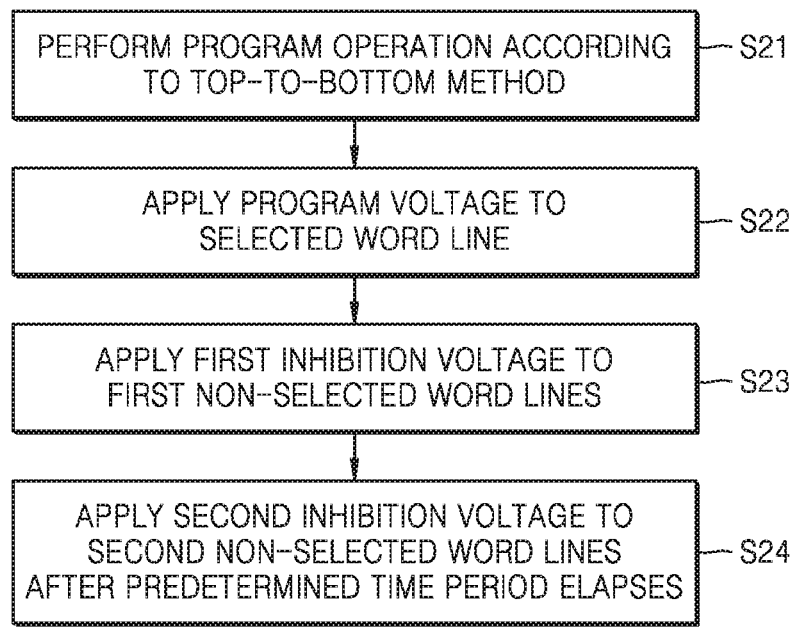

FIGS. 7 and 8 are flowcharts of a program operation of a nonvolatile memory device according to embodiments.

Referring to FIG. 7, in operation S11, a program operation may be performed on a selected cell string from among a plurality of cell strings provided in a nonvolatile memory device. The program operation may be performed by using a top-to-bottom method in which data is programmed in a direction from a memory cell close to a bit line to a memory cell close to a ground selection line from among a plurality of memory cells included in the selected cell string. Also, in operation S12, an $A^{th}$ memory cell may be selected during the program operation using the top-to-bottom method.

In operation S13, as the $A^{th}$ memory cell is selected, a program voltage may be applied to a selected word line connected to the $A^{th}$ memory cell. Also, in operation S14 the first inhibition voltage Vpass1 may be applied to first non-selected word lines connected to first non-selected memory cells located over the $A^{th}$ memory cell and the second inhibition voltage Vpass2 may be applied to second non-selected word lines connected to second non-selected memory cells located under the $A^{th}$ memory cell. In this case, the first inhibition voltage Vpass1 and the second inhibition voltage Vpass2 may be separately controlled to reduce HCI on the first non-selected memory cells. For example, the first inhibition voltage Vpass1 and the second inhibition voltage Vpass2 may be separately controlled so that a difference between a potential of a channel of the first non-selected memory cells and a potential of a channel of the second non-selected memory cells is minimized at a point in time when the first non-selected memory cells are selected as a level of the first inhibition voltage Vpass1 is increased. Such a potential difference may be minimized in various ways. For example, the potential difference may be minimized by adjusting levels of the first and second inhibition voltages Vpass1 and Vpass2 or adjusting rise timings of the first and second inhibition voltages Vpass1 and Vpass2. Alternatively, as described below in some embodiments, a predetermined condition may be determined and a method of controlling the first and second inhibition voltages Vpass1 and Vpass2 may be changed based on a result of the determination.

FIG. 8 illustrates an example where HCI is reduced by using a delay time for the second inhibition voltage Vpass2. Referring to FIG. 8, in operation S21, a program operation may be performed on a selected cell string from among a plurality of cell strings included in a nonvolatile memory device. The program operation may be performed by using a top-to-bottom method on a plurality of memory cells provided in the selected cell string. Also, in operation S22, a program voltage may be applied to a selected word line connected to a selected memory cell in the program operation using the top-to-bottom method.

In operation S23, a voltage signal may be applied to word lines of the plurality of memory cells of the selected cell string to perform a program operation on the selected memory cell. For example, a first inhibition voltage may be applied to word lines (e.g., first non-selected word lines) of upper non-selected memory cells located over the selected memory cell and close to a bit line. In operation S24, when a predetermined time period elapses after the first inhibition voltage is applied, a second inhibition voltage may be applied to word lines (e.g., second non-selected word lines) of lower non-selected memory cells located under the selected memory cell and close to a ground selection line.

Various embodiments for reducing disturbance due to HCI will now be described.

Figure 9A:
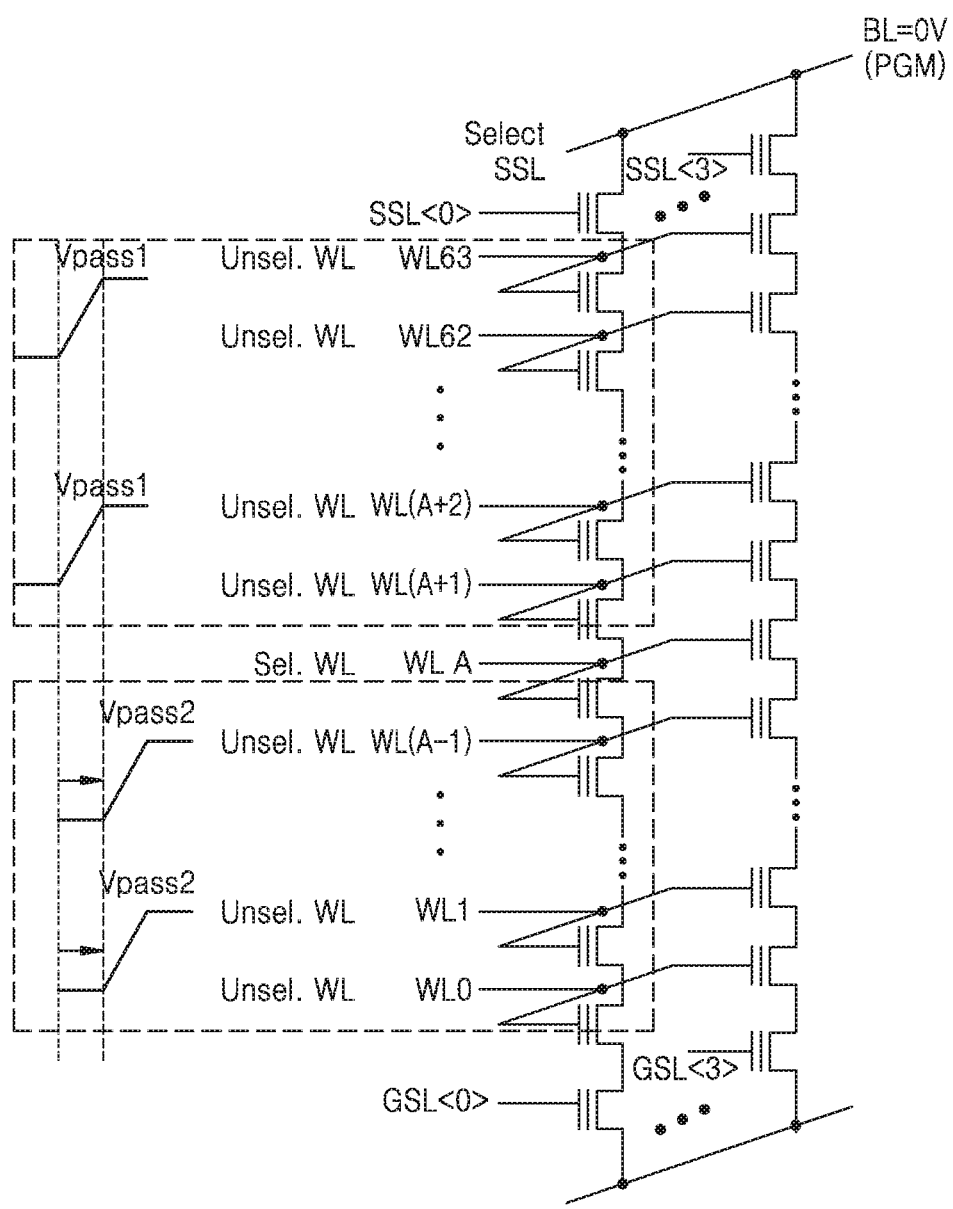
FIGS. 9A and 9B are circuit diagrams illustrating an example where a delay time is selectively used for a second inhibition voltage based on a memory cell having a specific height according to an embodiment.
Figure 9B:
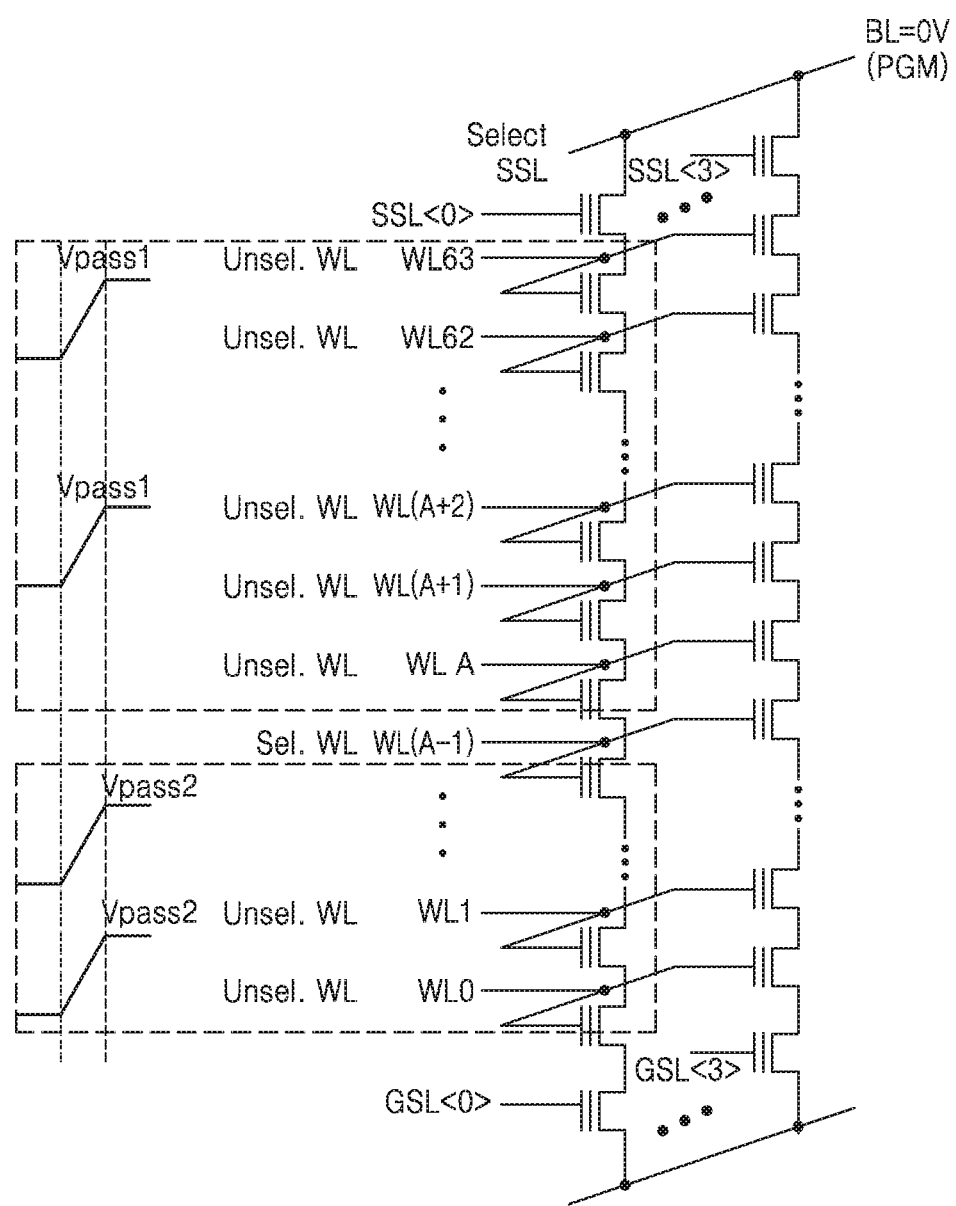

FIGS. 9A and 9B are circuit diagrams illustrating an example where a delay time is selectively used for a second inhibition voltage based on a memory cell having a specific height according to an embodiment.

Referring to FIG. 9A, as a $(A+1)^{th}$ memory cell is selected, a program voltage may be applied to a selected word line WL A, the first inhibition voltage Vpass1 may be applied to first non-selected word lines WL(A+1) through WL63 connected to upper non-selected memory cells, and the second inhibition voltage Vpass2 may be applied to second non-selected word lines WL0 through WL(A−1) connected to lower non-selected memory cells. A program operation may be sequentially downwardly performed in a direction from a $64^{th}$ memory cell that is a highest memory cell of a cell string, and memory cells located over a currently selected memory cell may be a programmed state.

HCI due to boosting of a channel of second non-selected memory cells may vary according to a length of the channel of the second non-selected memory cells. That is, the HCI influence may increase as a length of a boosted channel increases, and thus as a memory cell at a higher position in the cell string is selected, a length of the channel of the second non-selected memory cells may be increased. As a memory cell located at a lower position is selected when a program operation is performed on the cell string, a length of the channel of the second non-selected memory cells may be reduced. According to the present embodiment, based on a memory cell (e.g., a reference memory cell) having a specific height, a delay time may be used for the second inhibition voltage Vpass2 when the reference memory cell or a memory cell upper than the reference memory cell is selected, whereas a delay time may not be used for the second inhibition voltage Vpass2 when a memory cell lower than the reference memory cell is selected.

FIG. 9A illustrates an example where a delay time is used for the second inhibition voltage Vpass2 as the $(A+1)^{th}$ memory cell corresponding to a reference memory cell is selected. For example, a level of the second inhibition voltage Vpass2 may be increased when a predetermined time period elapses after a level of the first inhibition voltage Vpass1 is increased. In contrast, when an $A^{th}$ memory cell located under a reference memory cell is selected as shown in FIG. 9B, levels of the first inhibition voltage Vpass1 and the second inhibition voltage Vpass2 may be substantially simultaneously increased without having to separately adjust a rise timing of the second inhibition voltage Vpass2.

Figure 10:
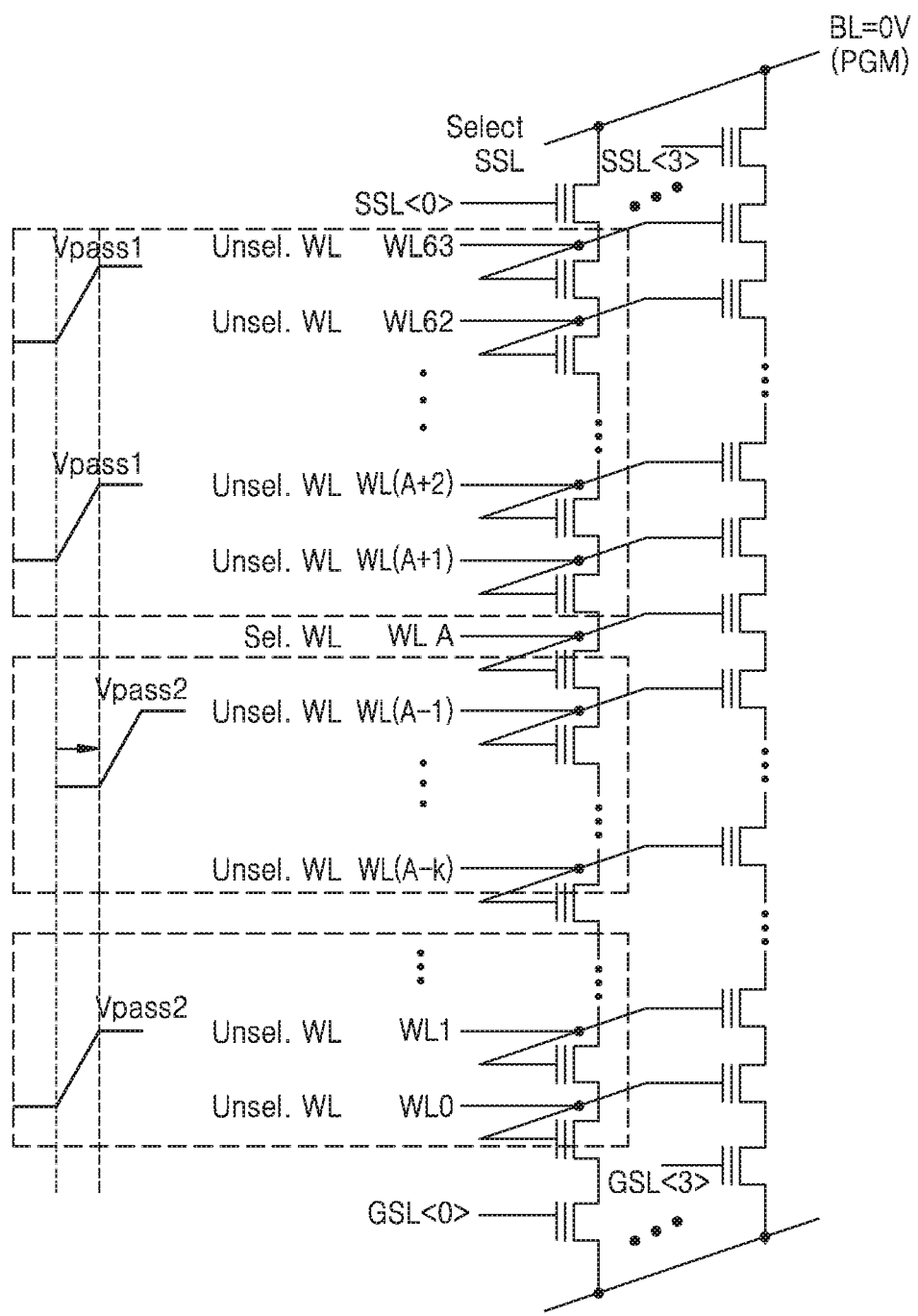
FIG. 10 is a circuit diagram illustrating an example where a delay time is selectively used for some of second non-selected word lines according to an embodiment.

FIG. 10 is a circuit diagram illustrating an example where a delay time is selectively used for some of second non-selected word lines according to an embodiment.

The HCI influence may occur as a channel of second non-selected memory cells is boosted. The channel that causes the HCI may be a channel located adjacent to a selected memory cell. Accordingly, a delay time may be used for only a second inhibition voltage applied to some of second non-selected word lines connected to the second non-selected memory cells. For example, the number of the second non-selected word lines for which the delay time is used may be preset. FIG. 10 illustrates an example where a delay time is used for k second non-selected word lines.

Referring to FIG. 10, as an $(A+1)^{th}$ memory cell is selected, a program voltage may be applied to a selected word line WL A, the first inhibition voltage Vpass1 may be applied to first non-selected word lines WL(A+1) through WL63, and the second inhibition voltage Vpass2 may be applied to second non-selected word lines WL0 through WL(A−1). In this case, a rise timing of a level of the second inhibition voltage Vpass2 applied to k second non-selected word lines WL(A−1) through WL(A−k) located under the selected word line WL A may be selectively adjusted. For example, a level of the second inhibition voltage Vpass2 applied to some second non-selected word lines WL0 through WL(A−k−1) connected to memory cells adjacent to a ground selection transistor from among the second non-selected word lines may be increased at substantially a same timing as that of the first inhibition voltage Vpass1. In contrast, the second inhibition voltage Vpass2 applied to the second non-selected word lines WL0 through WL(A−1) for which a delay time is used may be increased when a predetermined time period elapses after a level of the first inhibition voltage Vpass1 is increased.

According to the present embodiment, since a delay time is used for only some of the second non-selected word lines, HCI may be reduced. Furthermore, since a delay time used for voltage signals for a program operation is minimized, performance degradation may be minimized due to the additional time required for the program operation.

FIGS. 11A, 11B, 12A, 12B, 13A and 13B are diagrams illustrating an example where a delay time is selectively used for a second inhibition voltage by referring to data that is previously programmed according to an embodiment.

Figure 11A:
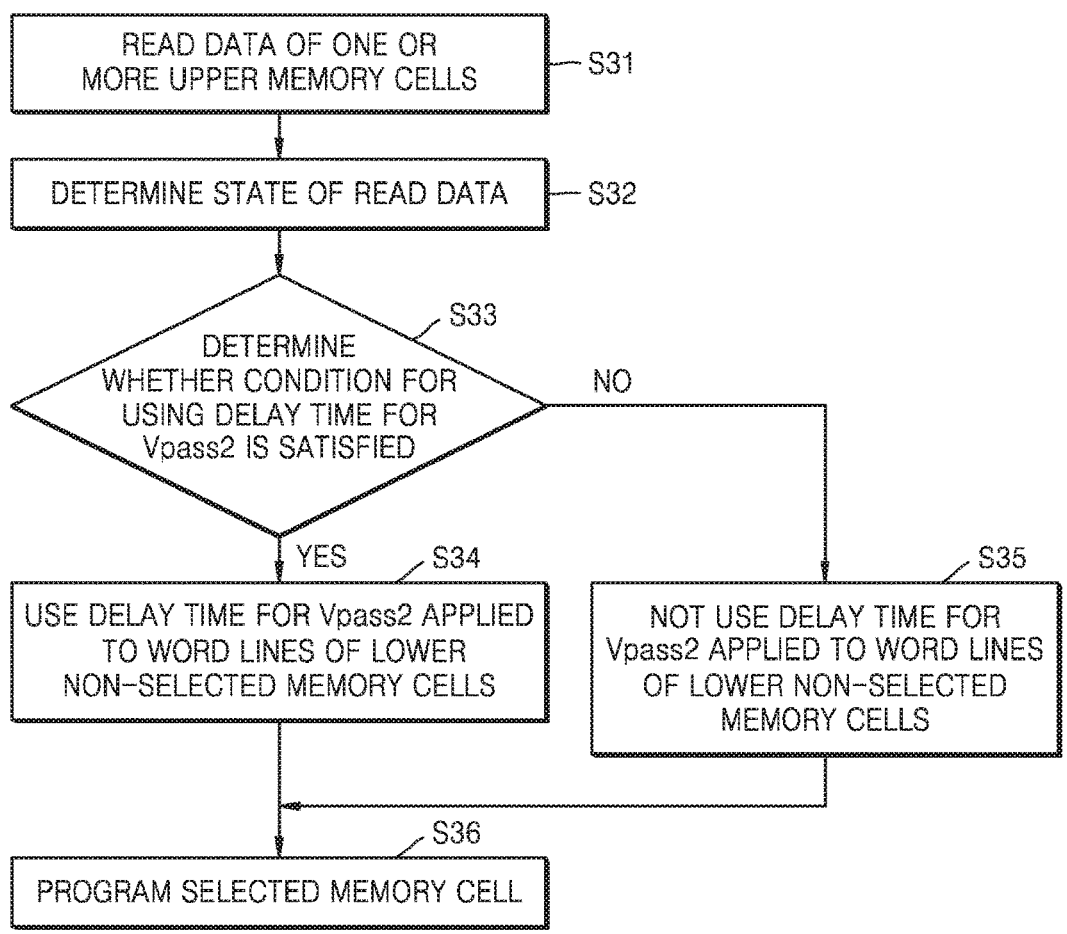

Referring to FIG. 11A, a nonvolatile memory device may read data that is previously programmed and may selectively use a delay time for a second inhibition voltage by determining a state of the read data. For example, when an $A^{th}$ memory cell is selected and programmed, in operation S31, data of one or more memory cells located over the $A^{th}$ memory cell may be read, and in operation S32, a state of the read data may be determined.

In operation S33, it may be determined whether a condition for using a delay time for the second inhibition voltage Vpass2 is satisfied based on the determined state of the data. When it is determined in operation S33 that the condition is satisfied, the example proceeds to operation S34. In operation S34, a delay time may be used for the second inhibition voltage Vpass2 applied to second non-selected word lines located under a selected memory cell. Accordingly, a level of the first inhibition voltage Vpass1 applied to first non-selected word lines located over the selected memory cell may be increased, and when a predetermined time period elapses, a level of the second inhibition voltage Vpass2 may be increased. Also, a delay time may be used for the second inhibition voltage Vpass2 in various ways as described above. For example, a delay time may be used for all second non-selected word lines or a delay time may be used for the second inhibition voltage Vpass2 applied to some of the second non-selected word lines.

In contrast, when it is determined in operation S33 that the condition is not satisfied, the example may proceed to operation S35. In operation S35, a delay time may not be used for the second inhibition voltage Vpass2 applied to the second non-selected word lines, and thus levels of the first inhibition voltage Vpass1 and the second inhibition voltage Vpass2 may be increased at substantially the same timings. Also, in operation S36, a program operation may be performed on the selected memory cell based on the various voltage signals.

Figure 11B:
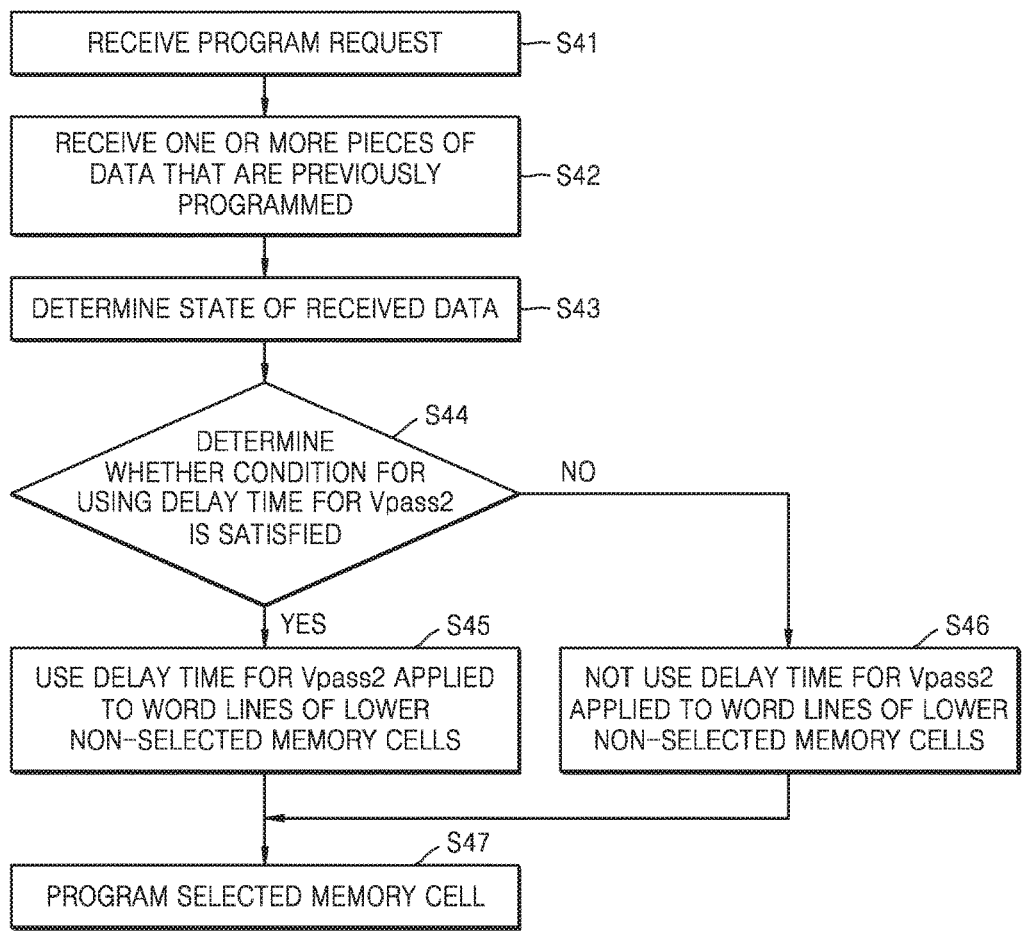

Referring to FIG. 11B, a memory controller may apply data that is previously programmed to a nonvolatile memory device when data is programmed. For example, in operation S41, the nonvolatile memory device may receive a data program request from the memory controller. In operation S42, the nonvolatile memory device may receive one or more pieces of data that are previously programmed along with data to be programmed. Also, in operation S43, the nonvolatile memory device may determine a state of the data received from the memory controller, and may selectively use a delay time for the second inhibition voltage Vpass2 according to a result of the determination as described with reference to FIG. 11A. For example, in operation S44, it may be determined whether a state of the received data satisfies a condition for using a delay time. When it is determined in operation S44 that the condition is satisfied, the example proceeds to operation S45. In operation S45, a delay time may be used for the second inhibition voltage Vpass2 applied to second non-selected word lines. When it is determined in operation S44 that the condition is not satisfied, the example proceeds to operation S46. In operation S46, a delay time may not be used for the second inhibition voltage Vpass2. Also, in operation S47, a program operation may be performed on a selected memory cell based on the above various voltage signals.

FIGS. 12A and 12B are tables showing various examples where a level of a second inhibition voltage is adjusted according to an operation of a nonvolatile memory device. In FIGS. 12A and 12B, it is assumed that each memory cell stores 3-bit data and thus a threshold voltage of each memory cell has any state from among first through eighth states (Vth1 through Vth8) corresponding to 8 distributions. In this case, the first state Vth1 may correspond to an erased state. FIGS. 12A and 12B illustrate an example where a programmed state of one first non-selected memory cell closest to a currently selected memory cell is referred to.

Referring to FIG. 12A, when a programmed state of one first non-selected memory cell located over and closest to a selected memory cell is determined and the determined programmed state is the first state Vth1 corresponding to an erased state, the risk of disturbance due to HCI may be high. Accordingly, a delay time may be used for the second inhibition voltage Vpass2 applied to second non-selected word lines located under the selected memory cell. In contrast, when the determined programmed state is any one of the second through eighth states Vth2 through Vth8 having an increased threshold voltage level, a delay time may not be used for the second inhibition voltage Vpass2, and thus levels of the first inhibition voltage Vpass1 and the second inhibition voltage Vpass2 may be increased at substantially the same timings.

FIG. 12B illustrates an example where a delay time is used for the second inhibition voltage Vpass2 when the possibility that a programmed state of a first non-selected memory cell closest to a currently selected memory cell is affected by HCI is high. For example, the risk of disturbance due to HCI may be increased as the first non-selected memory cell closest to the currently selected memory cell has a lower threshold voltage, and the risk of disturbance due to HCI may be reduced as the first non-selected memory cell closest to the currently selected memory cell has a higher threshold voltage. A delay time may be selectively used for the second inhibition voltage Vpass2 based on a predetermined state.

For example, when the closest first non-selected memory cell has any of first through $a^{th}$ states Vth1 through Vth a having a relatively low threshold voltage, a delay time may be used for the second inhibition voltage Vpass2, and when the closest first non-selected memory cell has any of $(a+1)^{th}$ through $8^{th}$ states Vth(a+1) through Vth8 having a relatively high threshold voltage, a delay time may not be used for the second inhibition voltage Vpass2.

FIGS. 13A and 13B are tables showing examples where programmed states of a plurality of (e.g., b) first non-selected memory cells adjacent to a currently selected memory cell are referred to. For example, in FIGS. 13A and 13B, a memory cell connected to a word line WL A is selected and programmed states of memory cells connected to b word lines WL(A+1) though WL(A+b) located over the selected memory cell are referred to.

Referring to FIG. 13A, programmed states of b first non-selected memory cells located over selected memory cells may be referred to. For example, the number of memory cells corresponding to an erased state (e.g., the first state Vth1) from among the b first non-selected memory cells may be determined.

If it is determined that at least one of the b first non-selected memory cells is programmed to an erased state (e.g., the first state Vth1), the possibility that the memory cell having the erased state (e.g., the first state Vth1) is disturbed by HCI may be high and a delay time may be used for the second inhibition voltage Vpass2 as described above. In contrast, when there is no memory cell that is programmed to the erased state (e.g., the first state Vth1) from among the b first non-selected memory cells, a delay time may not be used for the second inhibition voltage Vpass2 and levels of the first inhibition voltage Vpass1 and the second inhibition voltage Vpass2 may be increased at substantially the same timings.

Referring to FIG. 13B, it may be determined whether the number of memory cells having an erased state (e.g., the first state Vth1) from among b first non-selected memory cells is equal to or greater than a reference value. When the number of memory cells that are programmed to a state having a high threshold voltage is large, a resistance component due to the memory cells may be increased and the risk of disturbance due to HCI may be reduced. In contrast, when the number of memory cells that are programmed to the erased state (e.g., the first state Vth1) is large, a resistance component due to the memory cells may be reduced and the risk of disturbance due to HCI may be increased. Accordingly, the number of memory cells having the erased state (e.g., the first state Vth1) from among the b first non-selected memory cells may be compared with a predetermined reference value, and when the number of the memory cells having the erased state (e.g., the first state Vth1) is equal to or greater than the reference value, a delay time may be selectively used for the second inhibition voltage Vpass2.

Embodiments are not limited to FIG. 13B. For example, it may be determined whether the number of memory cells having the erased state (e.g., the first state Vth1) from among the b first non-selected memory cells is greater than the number of memory cells that are programmed to a state having a high threshold voltage. Alternatively, the number of memory cells having any of first through $a^{th}$ states Vth1 through Vth a having a relatively low threshold voltage may be determined as shown in FIG. 12B.

FIGS. 14, 15, 16 and 17 are diagrams illustrating waveforms of various signals for reducing HCI according to embodiments.

Figure 14:
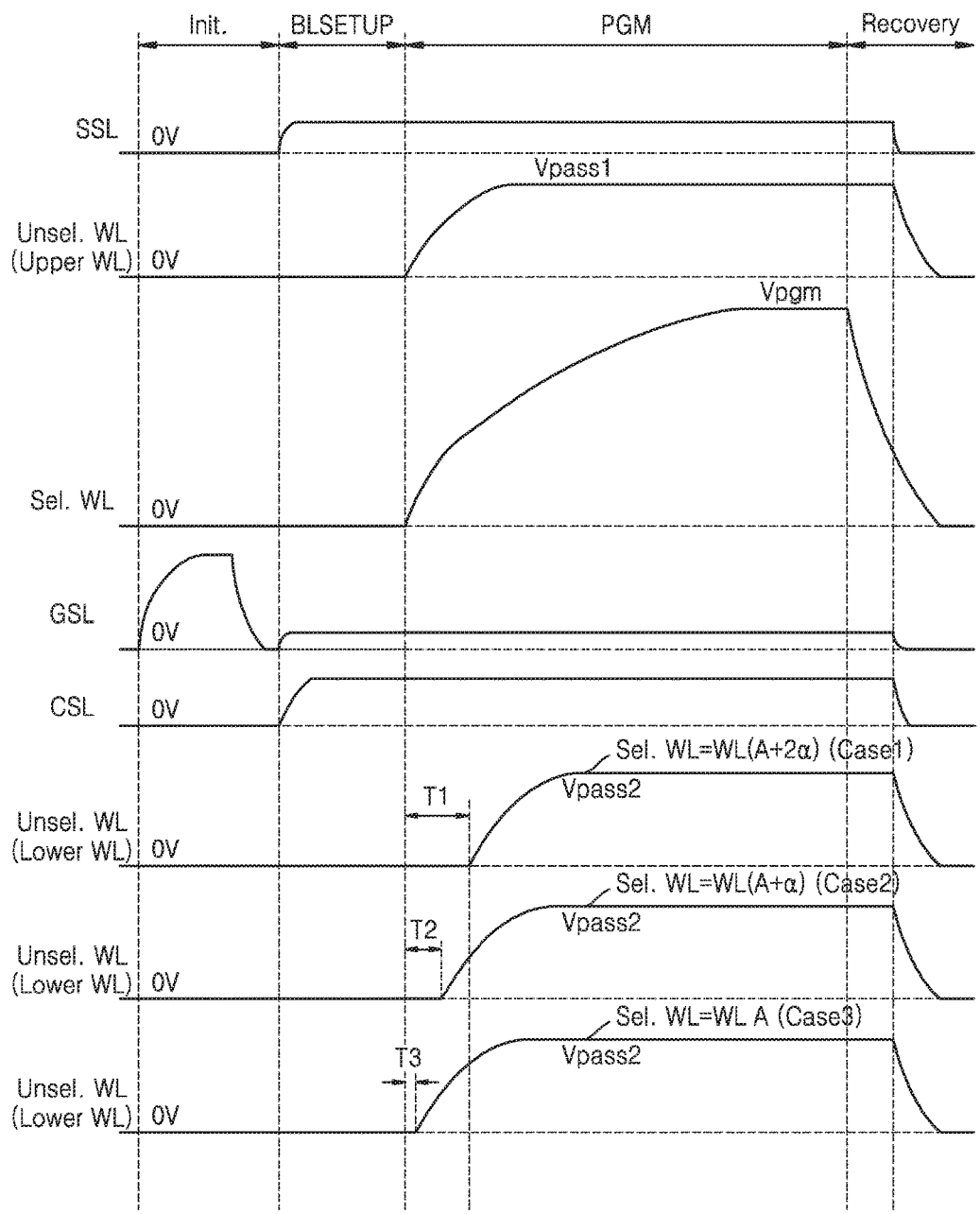
FIGS. 14, 15, 16 and 17 are diagrams illustrating waveforms of various signals for reducing HCI according to embodiments.

FIG. 14 illustrates an example where the amount of delay time used for the second inhibition voltage Vpass2 is differently adjusted according to a position (or a height) of a selected memory cell in a cell string. Referring to FIG. 14, waveforms of various signals may be set according to a program operation using a top-to-bottom method. For example, waveforms of the string selection line SSL, a first non-selected word line Upper WL, a selected word line, a second non-selected word line Lower WL, the ground selection line GSL, and a common source line may be set. In FIG. 14, a detailed description of signals having the same waveforms as those of signals of FIG. 6 will not be given.

A point in time when a level of the second non-selected word line Lower WL is increased may be changed as a program operation is performed on the cell string. For example, when a memory cell located at a relatively high position in the cell string is selected, the risk of disturbance due to HCI on a first non-selected memory cell located over the selected memory cell may be high. In contrast, when a memory cell located at a relatively low position in the cell string is selected, the risk of disturbance due to HCI on a first non-selected memory cell located over the selected memory cell may be low.

According to an embodiment, when a memory cell (e.g., a memory cell connected to a word line WL A+2α) located at a relatively high position in the cell string is selected, a level of the second inhibition voltage Vpass2 applied to second non-selected word lines located under the selected memory cell may be increased after a first delay time T1 (Case1). In contrast, when a memory cell (e.g., a memory cell connected to a word line WL A+α) located at a relatively low position is selected, a level of the second inhibition voltage Vpass2 applied to second non-selected word lines located under the selected memory cell may be increased after a second delay time T2 (Case2). Also, when a memory cell (e.g., a memory cell connected to a word line WL A) located at a lower position is selected, a level of the second inhibition voltage Vpass2 may be increased after a third delay time T3 (Case3).

In the graph of FIG. 14, the first delay time T1 may be greater than the second delay time T2, and the second delay time T2 may be greater than the third delay time T3. Also, although not shown in FIG. 14, when a memory cell located at a position lower than that in FIG. 14 is selected, a delay time may not be used for the second inhibition voltage Vpass2. Also, although the first through third delay times T1 through T3 are changed according to a position of a selected memory cell in an analog manner in FIG. 14, embodiments are not limited thereto. For example, a predetermined number of memory cells may be grouped into one unit, and the first through third delay times T1 through T3 may be changed stepwise according to the unit.

Embodiments for adjusting a voltage level to reduce HCI will now be described.

Figure 15:
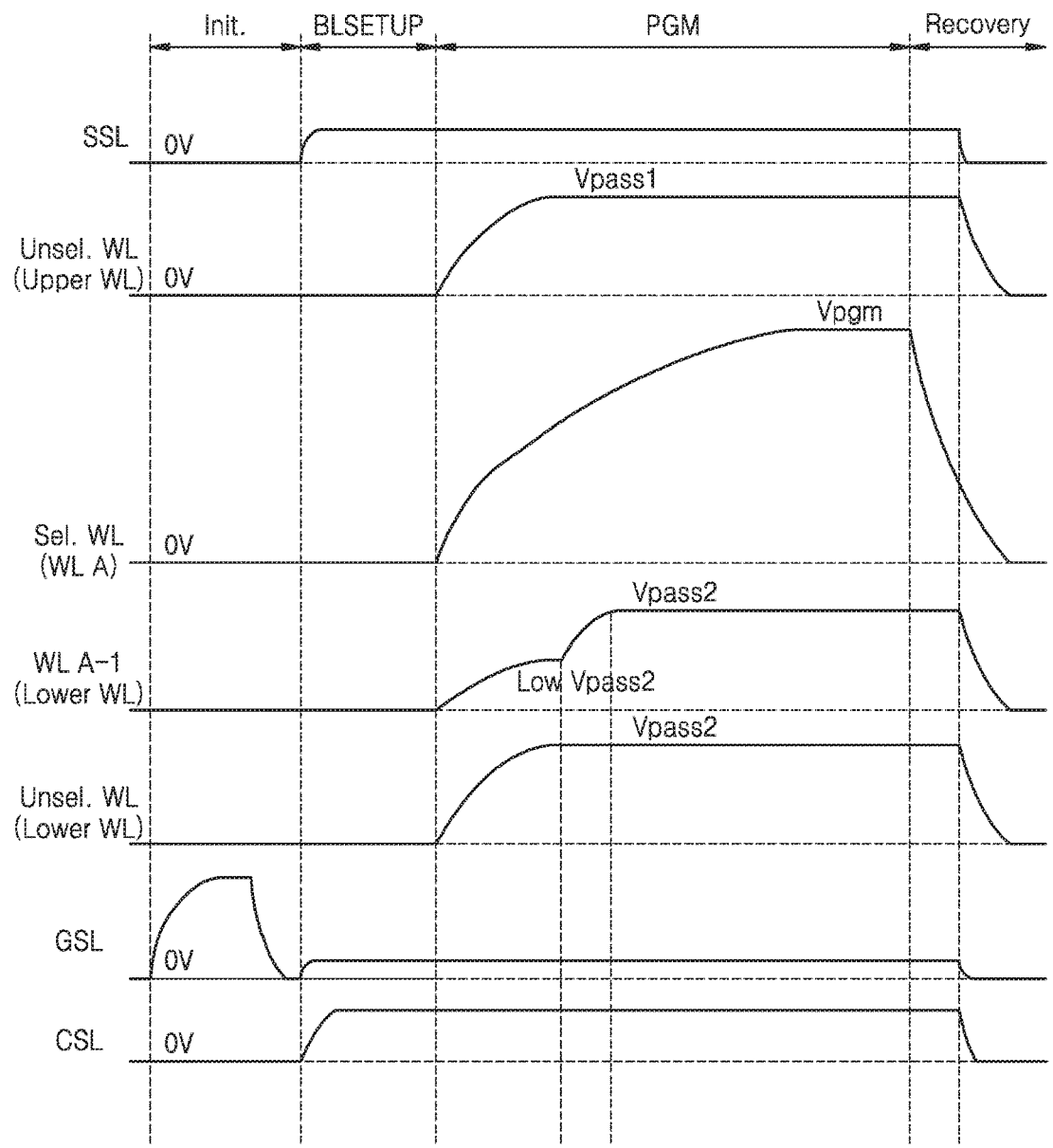

For example, a level of the second inhibition voltage Vpass2 applied to at least some of second non-selected word lines may be adjusted to reduce HCI as shown in FIG. 15. FIG. 15 illustrates an example where a memory cell connected to a $(A+1)^{th}$ word line WL A is selected and a level of the second inhibition voltage Vpas2 applied to an $A^{th}$ word line WL (A−1) located under the $(A+1)^{th}$ word line WL A and closest to the $(A+1)^{th}$ word line WL A is adjusted. However, embodiments are not limited thereto, and a level of the second inhibition voltage Vpass2 applied to two or more second non-selected word lines may be adjusted, or a level of all the second inhibition voltage Vpass2 applied to the second non-selected word lines may be adjusted.

Referring to FIG. 15, levels of various voltages may be increased for a program operation after an initialization interval and a bit line setup interval. For example, a level of the first inhibition voltage Vpass1 applied to the first non-selected word line Upper WL may be increased and a level of the program voltage Vpgm applied to the selected word line Sel. WL may also be increased.

Also, a low second inhibition voltage Low Vpass2 may be applied to at least one second non-selected word line Lower WL. The low second inhibition voltage Low Vpass2 may have a level (or an intermediate level) lower than levels of the first and second inhibition voltages Vpass1 and Vpass2. Next, the low second inhibition voltage Low Vpass2 may be increased to a level corresponding to the second inhibition voltage Vpass2. For example, a potential difference between a channel of first non-selected memory cells and a channel of second non-selected memory cells may be reduced as the low second inhibition voltage Low Vpass2 is applied, thereby reducing HCI.

Although a point in time when the low second inhibition voltage Low Vpass2 is increased is the same as a point in time when the first and second inhibition voltages Vpass1 and Vpass2 are increased in FIG. 15, embodiments are not limited thereto. For example, a level of the low second inhibition voltage Low Vpass2 may be increased after a predetermined delay time elapses. Also, although the low second inhibition voltage Low Vpass2 is increased to a level corresponding to the second inhibition voltage Vpass2 at a point in time when the first and second inhibition voltages Vpass1 and Vpass2 reach steady levels in FIG. 15, such a timing may also be changed. Also, although the second inhibition voltage Vpass2 is changed to an intermediate level and then reaches a steady level in FIG. 15, the effect identical or similar to that of the present embodiment may be achieved by adjusting a rising gradient of a level of the second inhibition voltage Vpass2.

Figure 16:
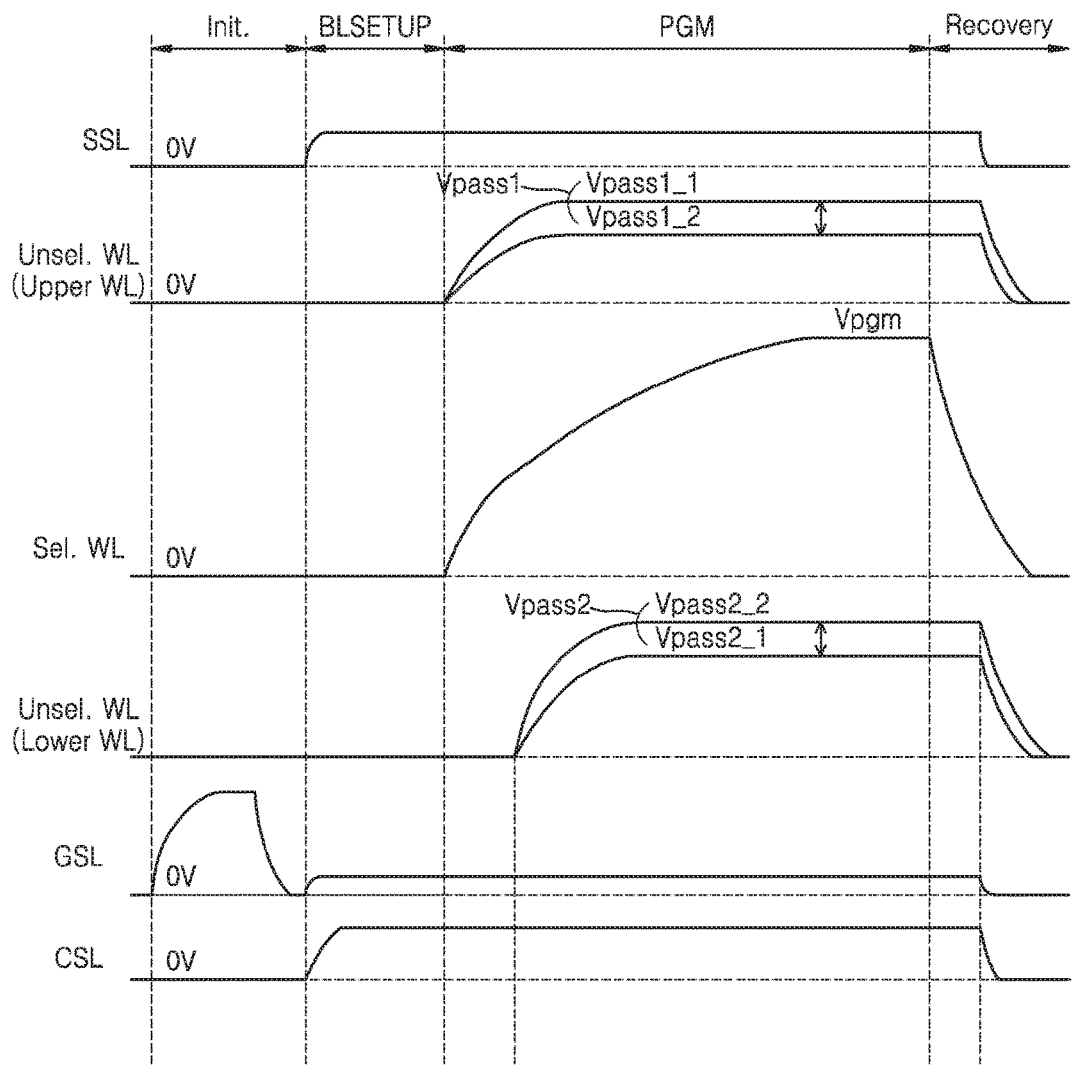

FIG. 16 illustrates an example where levels of the first and second inhibition voltages Vpass1 and Vpass2 are adjusted according to a position of a selected memory cell.

As in the above embodiments, when a memory cell located at a relatively high position is selected, the risk of HCI occurring on first non-selected memory cells is high. Accordingly, a level of a first inhibition voltage Vpass1_1 applied to first non-selected word lines Upper WL when memory cells having a relatively high position are selected may be higher than a level of a first inhibition voltage Vpass1_2 applied to first non-selected word lines when memory cells having a relatively low position are selected. Also, a level of a second inhibition voltage Vpass2_1 applied to second non-selected word lines Lower WL when memory cells having a relatively high position are selected may be lower than a level of a second inhibition voltage Vpass2_2 applied to second non-selected word lines when memory cells having a relatively low position are selected.

According to the present embodiment, since a level of the second inhibition voltage Vpass2_1 is relatively low when a memory cell having a relatively high position is selected, a potential difference between a channel of first non-selected memory cells and a channel of second non-selected memory cells may be reduced. Also, since a level of the first inhibition voltage Vpass1_1 is relatively high, a point in time when the first non-selected memory cells are turned on may get earlier, and a potential difference between the channel of the first non-selected memory cells and the channel of the second non-selected memory cells at the point in time when the first non-selected memory cells are turned on may be reduced.

Although levels of the first and second inhibition voltages Vpass1 and Vpass2 are adjusted together in FIG. 16, embodiments are not limited thereto. For example, a level of only one of the first and second inhibition voltages Vpass1 and Vpass2 may be selectively adjusted.

Also, although a level of the first inhibition voltage Vpass1_1 is increased when memory cells having a relatively high position are selected in FIG. 16, embodiments are not limited thereto. For example, since a level of the second inhibition voltage Vpass2_1 is reduced when memory cells having a relatively high position are selected, voltage signals may be controlled so that a level of the first inhibition voltage Vpass1_1 is reduced correspondingly.

Figure 17:
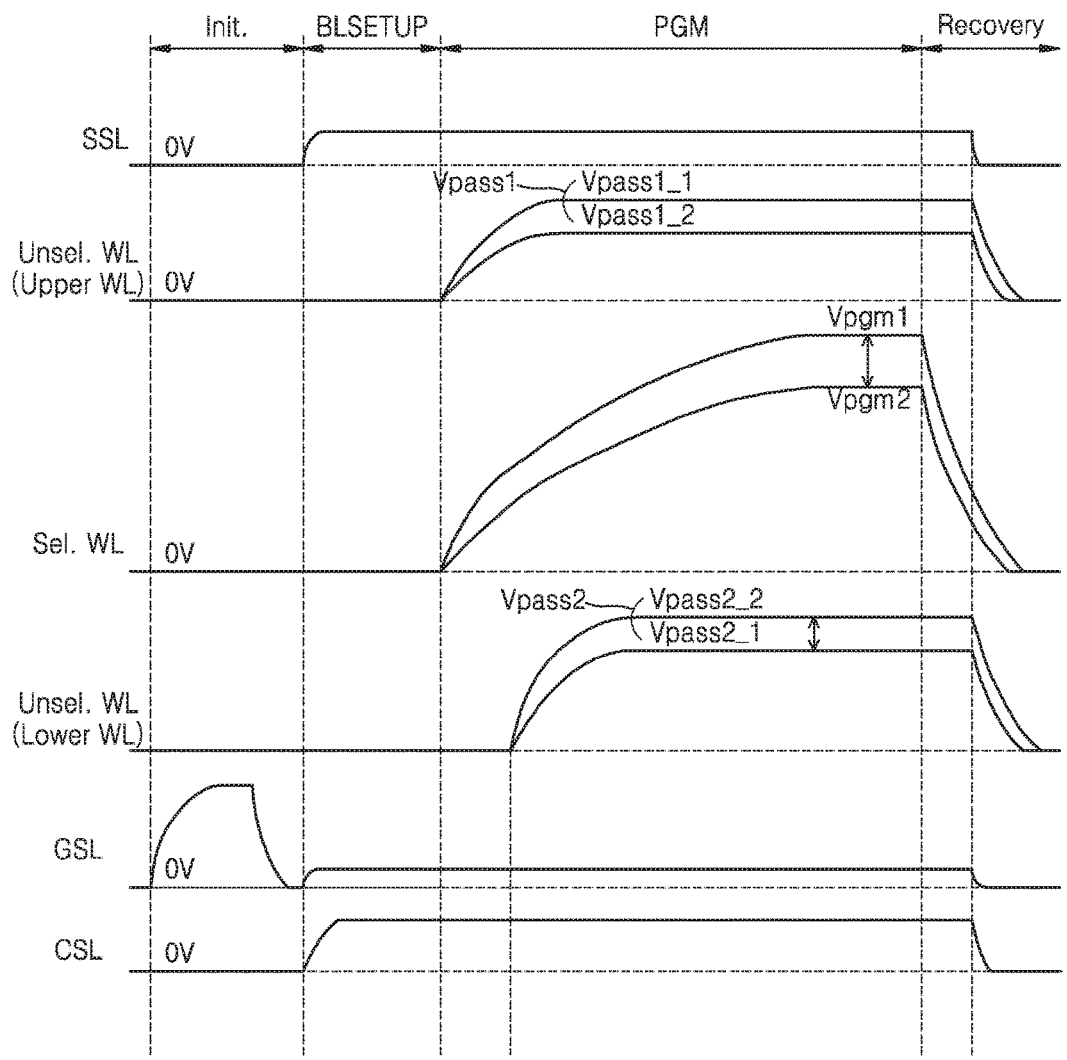

FIG. 17 illustrates an example where levels of first and second inhibition voltages are adjusted when one memory cell stores multi-bit data.

When one memory cell stores multi-bit data, each memory cell may be programmed to one of a plurality of threshold voltage states, and a level of a program voltage may vary according to a programmed state. In this case, when a threshold voltage of the programmed state is high, a first program voltage Vpgm1 having a relatively high level may be generated. In contrast, when a threshold voltage is small, a second program voltage Vpgm2 having a relatively low level may be generated.

In this case, the HCI influence when a level of a program voltage is high may be large. For example, since a point in time when a selected memory cell is turned on may be late, a potential difference between a channel of first non-selected memory cells and a channel of second non-selected memory cells may be high at the point in time when the selected memory cell is turned on. According to an embodiment, during a program operation using the first program voltage Vpgm1, the HCI influence may be reduced by causing a level of the second inhibition voltage Vpass2_1 to be relatively low. In contrast, during a program operation using the second program voltage Vpgm2, a level of the second inhibition voltage Vpass2_2 may be set to be relatively high.

Although a level of the first inhibition voltage Vpass1_1 is set to be relatively high during a program operation using the first program voltage Vpgm1 in FIG. 17, embodiments are not limited thereto and voltage signals may be controlled so that a level of the first inhibition voltage Vpass1_1 is reduced when a level of the second inhibition voltage Vpass2_1 is reduced as in the above embodiments.

Although a delay time is used at a timing when a level of the second inhibition voltage Vpass2 is increased in FIGS. 16 and 17, embodiments are not limited thereto. For example, since HCI may be reduced by adjusting a level of the second inhibition voltage Vpass2 in the above embodiments, a level of the second inhibition voltage Vpass2 may be increased at substantially the same timing as that of the first inhibition voltage Vpass1.

Levels of the first and second inhibition voltages Vpass1 and Vpass2 may be adjusted in various ways as described in the above embodiments. For example, levels of the first and second inhibition voltages Vpass1 and Vpass2 may be adjusted for only some of second non-selected word lines, or may be adjusted only when memory cells located at a specific height or more are selected. Also, levels of the first and second inhibition voltages Vpass1 and Vpass2 may be selectively adjusted by determining states of one or more pieces of data that are previously programmed.

Figure 18A:
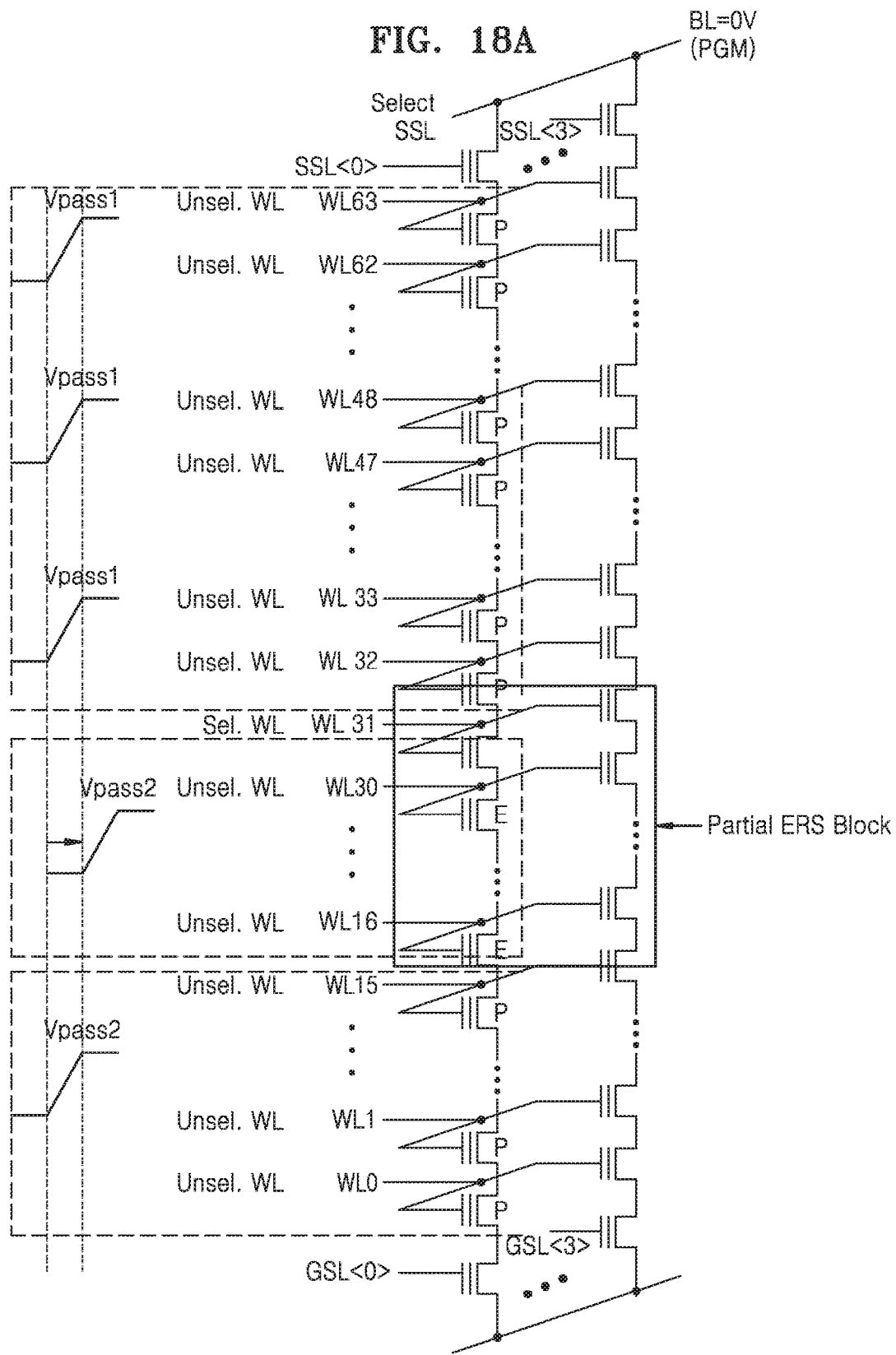

FIGS. 18A and 18B are circuit diagrams illustrating an example where a partial erase block exists according to an embodiment. FIG. 18A illustrates a case where one partial erase block exists in a cell string. FIG. 18B illustrates a case where two or more partial erase blocks exist.

Referring to FIG. 18A, the cell string may be programmed according to a top-to-bottom method. In this case, some memory cells from among memory cells included in the cell string may be memory cells included in a partial erase block. That is, even when the top-to-bottom method is used, the partial erase block may include memory cells having an erased state, and programmed memory cells may exist under the partial erase block.

The use of a delay time for the second inhibition voltage Vpass2 or the adjustment of a level according to embodiments may be performed on the memory cells included in the partial erase block. For example, some of second non-selected memory cells located under a selected memory cell may be memory cells included in the partial erase block, and a delay time may be used for the second inhibition voltage Vpass2 applied to the second non-selected memory cells in the partial erase block. In contrast, a delay time may not be used for second non-selected memory cells (or programmed second non-selected memory cells) outside the partial erase block.

As shown in FIG. 18B, two or more partial erase blocks may exist in one cell string, and in this case, a delay time for the second inhibition voltage Vpass2 may be selectively used for second non-selected memory cells of the two or more partial erase blocks. Also, although a delay time is used to reduce HCI in FIGS. 18A and 18B, a level of the second inhibition voltage Vpass2 may be adjusted to reduce HCI as in the above embodiments.

According to an embodiment of FIGS. 18A and 18B, since memory cells in each partial erase block are memory cells having an erased state and memory cells under the partial erase block are memory cells having a programmed state, the embodiment of FIGS. 18A and 18B may include a bottom-to-top programming method. That is, embodiments may be applied to a bottom-to-top programming method using a partial erase block.

Even in FIGS. 18A and 18B, a delay time may be used for only some (e.g., word lines adjacent to a selected memory cell) from among second non-selected word lines in a manner identical or similar to that in the above embodiments, or a delay time may be used only when memory cells located at a specific height or more are selected. Also, a delay time may be selectively used by determining states of one or more pieces of data that are previously programmed.

Figure 19:
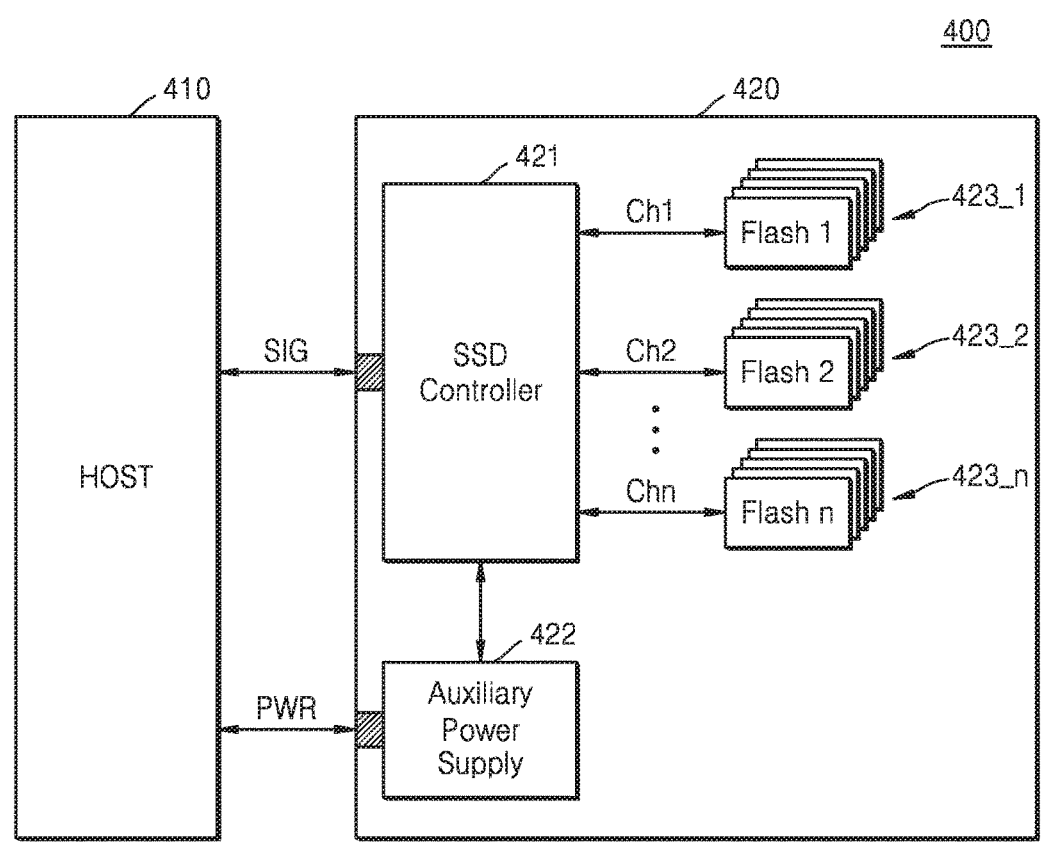
FIG. 19 is a block diagram illustrating an example where a memory device is applied to a solid-state drive (SSD) system according to embodiments.

FIG. 19 is a block diagram illustrating an example where a memory device is applied to an SSD system 400 according to embodiments.

Referring to FIG. 19, the SSD system 400 may include a host 410 and an SSD 420. The SSD 420 transmits or receives a signal SIG to or from the host 410 through a signal connector, and receives power PWR through a power connector. The SSD 420 may include an SSD controller 421, an auxiliary power supply device 422, and memory devices 423_1 through 423_n. Each of the memory devices 423_1 through 423_n may be a NAND flash memory device having a 3D structure. In this case, the SSD 420 may be implemented by using embodiments described with reference to FIGS. 1 through 18B. Accordingly, each of the memory devices 423_1 through 423_n may include a plurality of cell strings, each of the cell strings may include a plurality of memory cells that are vertically located, and a program operation may be performed according to a top-to-bottom method on the plurality of memory cells. Also, in order to reduce HCI, levels and rise timings of various voltage signals applied to word lines connected to the plurality of memory cells may be adjusted.

According to a non-volatile memory device and a programming method thereof according to the inventive concept, disturbance due to HCI in a program operation using a top-to-bottom method on 3D NAND memory cells may be reduced.

While the inventive concept has been particularly shown and described with reference to embodiments thereof by using specific terms, the embodiments and terms have merely been used to explain the inventive concept and should not be construed as limiting the scope of the inventive concept as defined by the claims. The embodiments should be considered in a descriptive sense only and not for purposes of limitation. Therefore, the scope of the inventive concept is defined not by the detailed description of the inventive concept but by the appended claims, and all differences within the scope will be construed as being included in the present inventive concept.

What is claimed is:

1. A programming method of a nonvolatile memory device comprising a plurality of cell strings, each of the plurality of cell strings comprising a plurality of memory cells vertically stacked on a substrate, the programming method comprising:
   applying a programming voltage to a selected memory cell from among the plurality of memory cells included in a cell string from among the plurality of cell strings;
   applying a first inhibition voltage to first non-selected word lines connected to first non-selected memory cells from among the plurality of cell strings located over the selected memory cell in the cell string; and
   applying a second inhibition voltage to second non-selected word lines connected to second non-selected memory cells from among the plurality of cell strings located under the selected memory cell,
   wherein the second inhibition voltage is applied after a predetermined delay time from the applying the first inhibition voltage, and
   wherein, when a program operation is performed on the selected memory cell based on a top-to-bottom programming method, the first non-selected memory cells are memory cells that are previously programmed and the second non-selected memory cells are memory cells that are not yet programmed.

2. The programming method of claim 1, wherein the nonvolatile memory device comprises a memory cell array and the plurality of memory cells comprise three-dimensional (3D) NAND memory cells.

3. The programming method of claim 1, wherein the predetermined delay time is a minimum delay required for the first inhibition voltage to turn on the first non-selected memory cells before the second inhibition voltage is applied to the second non-selected word lines.

4. The programming method of claim 3, wherein, after the first inhibition voltage reaches a steady level, the second inhibition voltage is applied to the second non-selected word lines.

5. The programming method of claim 1, wherein each of the plurality of cell strings comprises first through $N^{th}$ memory cells vertically stacked on the substrate,
   wherein N is an integer equal to or greater than 2 and wherein the first memory cell is adjacent to a ground selection transistor and the $N^{th}$ memory cell is adjacent to a string selection transistor.

6. The programming method of claim 5, wherein, when the first memory cell through an $A^{th}$ memory cell from among the plurality of memory cells are selected, a level of the second inhibition voltage is increased at a point in time that is substantially the same as a point in time when the first inhibition voltage is increased, and
   when $(A+1)^{th}$ through the $N^{th}$ memory cells from among the plurality of memory cells are selected, the second inhibition voltage is applied to the second non-selected word lines after the predetermined delay time, wherein A is an integer equal to or greater than 2 and less than N.

7. The programming method of claim 5, wherein, when an $A^{th}$ memory cell from among the plurality of memory cells is selected, the predetermined delay time is selectively used for the second inhibition voltage applied to the second non-selected word lines connected to a predetermined number of the second non-selected memory cells adjacent to the $A^{th}$ memory cell, wherein A is an integer equal to or greater than 2 and less than N.

8. The programming method of claim 5, further comprising, when an $A^{th}$ memory cell from among the plurality of memory cells is selected, determining a programmed state of one or more of the first non-selected memory cells adjacent to the $A^{th}$ memory cell, wherein A is an integer equal to or greater than 2 and less than N,
   wherein the applying the second inhibition voltage comprises selectively using the predetermined delay time for the second inhibition voltage according to a result of the determining.

9. The programming method of claim 8, wherein, when a programmed state of a $(A+1)^{th}$ memory cell located over and adjacent to the $A^{th}$ memory cell corresponds to an erased state, the second inhibition voltage is applied to the second non-selected word lines after the predetermined delay time.

10. The programming method of claim 8, wherein, when a programmed state of at least one memory cell from among a predetermined number of the first non-selected memory cells located over and adjacent to the $A^{th}$ memory cell corresponds to an erased state, the second inhibition voltage is applied to the second non-selected word lines after the predetermined delay time.

11. The programming method of claim 1, wherein, when a first memory cell of each of one or more cell strings is selected, a delay time having a first value is used as the predetermined delay time for the second inhibition voltage, and
   when a second memory cell located under the first memory cell is selected, a delay time having a second value less than the first value is used as the predetermined delay time for the second inhibition voltage.

12. A programming method of a nonvolatile memory device comprising three-dimensional (3D) NAND memory cells vertically located on a substrate, the programming method comprising:
applying a program voltage to a word line connected to a selected memory cell of the 3D NAND memory cells in a top-to-bottom programming method;
applying a first inhibition voltage to a first non-selected word line connected to a first non-selected memory cell of the 3D NAND memory cells that is located over the selected memory cell and is previously programmed; and
applying a second inhibition voltage to a second non-selected word line connected to a second non-selected memory cell of the 3D NAND memory cells that is located under the selected memory cell and is not yet programmed,
wherein at least one of a level, a level rising gradient, and a rise timing of the second inhibition voltage is controlled differently than a level, a level rising gradient and a rise timing of the first inhibition voltage.

13. The programming method of claim 12, wherein the second inhibition voltage is controlled to reach a steady level later than the first inhibition voltage.

14. The programming method of claim 12, wherein the second inhibition voltage is controlled to have a level lower than a level of the first inhibition voltage.

15. The programming method of claim 13, wherein the second inhibition voltage is controlled to have an intermediate level at a point in time when the first non-selected memory cell is turned on and to reach the steady level after the first non-selected memory cell is turned on.

16. The programming method of claim 12, wherein a first program voltage having a relatively high level or a second program voltage having a relatively low level is applied as the program voltage according to a threshold voltage state to be programmed,
wherein a level of the second inhibition voltage when the first program voltage is applied and a level of the second inhibition voltage when the second program voltage is applied are different from each other.

17. A nonvolatile memory device comprising:
a memory cell array comprising a plurality of cell strings each comprising a plurality of memory cells vertically located on a substrate;
a voltage generator configured to generate, during a program operation performed on the memory cell array, a program voltage applied to a word line connected to a selected memory cell from among the plurality of memory cells, a first inhibition voltage applied to first non-selected word lines connected to first non-selected memory cells from among the plurality of memory cells located over the selected memory cell, and a second inhibition voltage applied to second non-selected word lines connected to second non-selected memory cells from among the plurality of memory cells located under the selected memory cell; and
a control logic unit configured to control the program operation to be performed in a direction from an upper memory cell to a lower memory cell in each of the plurality of cell strings and to control at least one from among a level and a rise timing of the second inhibition voltage to be different than a level and a rise timing of the first inhibition voltage, wherein the first non-selected memory cells are memory cells that are previously programmed and the second non-selected memory cells are memory cells that are not yet programmed.

18. The nonvolatile memory device of claim 17, wherein the control logic unit is further configured to control the voltage generator so that the level of the second inhibition voltage is increased later than the level of the first inhibition voltage.

19. The nonvolatile memory device of claim 17, wherein the control logic unit is further configured to control the voltage generator so that the level of the second inhibition voltage is lower than the level of the first inhibition voltage.

20. The nonvolatile memory device of claim 17, further comprising a row decoder configured to receive the program voltage, the first inhibition voltage, and the second inhibition voltage from the voltage generator and to apply the program voltage, the first inhibition voltage, and the second inhibition voltage to the memory cell array,
wherein the control logic unit is further configured to control the voltage generator so that the second inhibition voltage is applied later than the first inhibition voltage to the row decoder.

* * * * *